| (12) | United States Patent | (10) Patent No.: | US 11,733,727 B2 |
|---|---|---|---|
| | Bae et al. | (45) Date of Patent: | Aug. 22, 2023 |

(54) INTEGRATED CIRCUIT USING BIAS CURRENT, BIAS CURRENT GENERATING DEVICE, AND OPERATING METHOD FOR THE SAME

(71) Applicant: SAMSUNG ELECTRONICS CO., LTD., Suwon-si (KR)

(72) Inventors: Junhan Bae, Hwaseong-si (KR); Gyeongseok Song, Busan (KR); Kyeong-Joon Ko, Yongin-si (KR); Jaehyun Park, Seoul (KR); Hajung Park, Suwon-si (KR); Ho-Bin Song, Daejeon (KR)

(73) Assignee: SAMSUNG ELECTRONICS CO., LTD.

( * ) Notice: Subject to any disclaimer, the term of this patent is extended or adjusted under 35 U.S.C. 154(b) by 0 days.

(21) Appl. No.: 17/680,386

(22) Filed: Feb. 25, 2022

(65) Prior Publication Data

US 2022/0334605 A1 Oct. 20, 2022

(30) Foreign Application Priority Data

Apr. 14, 2021 (KR) .......................... 10-2021-0048184

(51) Int. Cl.
  *G05F 3/20* (2006.01)
  *H03F 3/16* (2006.01)
  *H03K 17/22* (2006.01)

(52) U.S. Cl.
  CPC .............. *G05F 3/205* (2013.01); *H03F 3/16* (2013.01); *H03K 17/223* (2013.01)

(58) Field of Classification Search
  None
  See application file for complete search history.

(56) References Cited

U.S. PATENT DOCUMENTS

| 6,980,020 | B2 | 12/2005 | Best et al. |
|---|---|---|---|
| 7,454,305 | B2 | 11/2008 | Bonaccio et al. |
| 8,482,293 | B2 | 7/2013 | Tyan et al. |
| 9,660,647 | B2 * | 5/2017 | Chern ...................... G11C 7/00 |
| 10,845,837 | B2 | 11/2020 | Bae et al. |
| 2015/0349793 | A1 | 12/2015 | Saripalli et al. |

FOREIGN PATENT DOCUMENTS

| CN | 105071785 A | 11/2015 |
|---|---|---|
| CN | 105575837 A | 5/2016 |
| CN | 105094205 B | 8/2017 |

* cited by examiner

*Primary Examiner* — Jeffery S Zweizig
(74) *Attorney, Agent, or Firm* — Fish & Richardson P.C.

(57) ABSTRACT

Disclosed is an integrated circuit including a first bias current generating circuit. The first bias current generating circuit includes a first amplifier receiving a reference voltage and a first voltage and amplifying a difference between them to output a first output voltage, a first bias current generator receiving the first output voltage and outputting a first bias current in response to the first output voltage, a variable resistor receiving the first bias current and outputting the first voltage in response to the first bias current and a calibration code, a second bias current generator receiving the first output voltage and outputting a second bias current to a peripheral circuit in response to the first output voltage, and a third bias current generator receiving the first output voltage and outputting a third bias current to an external device through a first pad in response to the first output voltage.

18 Claims, 17 Drawing Sheets

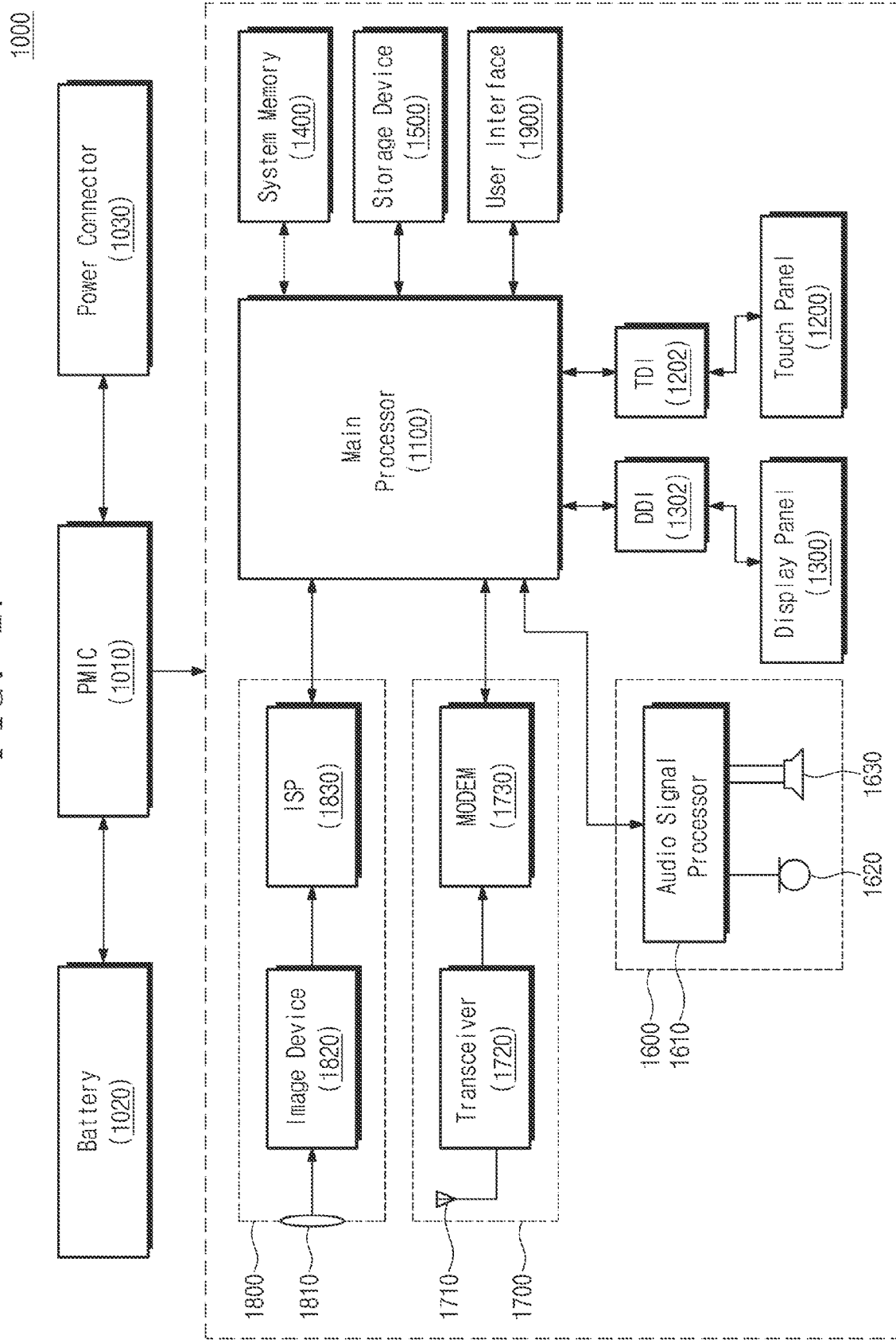

INTEGRATED CIRCUIT USING BIAS CURRENT, BIAS CURRENT GENERATING DEVICE, AND OPERATING METHOD FOR THE SAME

CROSS-REFERENCE TO RELATED APPLICATIONS

This application claims priority under 35 U.S.C. § 119 to Korean Patent Application No. 10-2021-0048184 filed on Apr. 14, 2021, in the Korean Intellectual Property Office, the disclosure of which is incorporated by reference herein in its entirety.

BACKGROUND

Embodiments of the present invention herein relate generally to an electronic device, and more particularly, relate to an integrated circuit capable of calibrating a bias current by using a removable external resistor, a bias current generating device, and an operating method for such bias current generation device.

Electronic devices, in particular, semiconductor devices are fabricated by using various semiconductor elements. For example, various elements of an integrated circuit, such as a resistors, capacitors, and transistors, are fabricated by using semiconductor materials and technologies. Operating characteristics of the semiconductor elements may vary with various enviromental factors such as a temperature, humidity, and spatial location on a wafer.

That is, nominal resistance values for the resistors, capacitances for capacitors, and transistor current values may vary with process variations in a fabricating process.

Various currents or voltages are used in the semiconductor device. Specific components in the semiconductor device may need relative currents or voltages. For example, the same fabrication process variations are applied to semiconductor elements in the semiconductor device for operation. Accordingly, the fabrication process variations may be canceled out in the specific components, and the specific components may need relative currents or voltages, which do not need calibration.

Any other components in the semiconductor device may need absolute currents or voltages. For example, the fabrication process variations may not be canceled out in the some components of the semiconductor device. In this case, operating characteristics of such components may vary with the fabrication process variations. Accordingly, the other components may need currents or voltages calibrated to compensate for the fabrication process variations, that is, absolute currents or voltages.

As such, elements for generating relative currents or voltages and elements for generating absolute currents or voltages are necessary in the semiconductor device. In particular, there is a demand for semiconductor devices which include current or voltage generating elements with reduced complexity, reduced manufacturing costs.

SUMMARY

Embodiments of the present disclosure provide an integrated circuit using a bias current and having reduced complexity and improved expandability, a bias current generating device, and an operating method for the bias current generating device.

According to an embodiment, an integrated circuit includes a peripheral circuit, and a first bias current generating circuit. The first bias current generating circuit includes a first amplifier that receives a reference voltage and a first voltage, and amplifies a difference between the first voltage and the reference voltage to output a first output voltage, a first bias current generator that receives the first output voltage and outputs a first bias current in response to the first output voltage, a variable resistor that receives the first bias current from the first bias current generator and outputs the first voltage in response to the first bias current and a calibration code, a second bias current generator that receives the first output voltage and outputs a second bias current to the peripheral circuit in response to the first output voltage, and a third bias current generator that receives the first output voltage and outputs a third bias current to an external device through a first pad in response to the first output voltage.

According to an embodiment, a bias current generating device includes an electrical fuse that stores a calibration code, a first amplifier that receives a reference voltage and a first voltage and amplifies a difference between the first voltage and the reference voltage to output a first output voltage, a first bias current generator that receives the first output voltage and outputs a first bias current in response to the first output voltage, a variable resistor that receives the first bias current from the first bias current generator, receives the calibration code from the electrical fuse, and outputs the first voltage in response to the first bias current and the calibration code, a second bias current generator that receives the first output voltage and outputs a second bias current to the peripheral circuit in response to the first output voltage, a third bias current generator that receives the first output voltage and outputs a third bias current to an external device through a pad in response to the first output voltage, a second amplifier that receives the reference voltage and a second voltage and amplifies a difference between the second voltage and the reference voltage to output a second output voltage, a fourth bias current generator that receives the second output voltage and outputs a fourth bias current in response to the second output voltage, a first resistor that receives the fourth bias current from the fourth bias current generator and outputs the second voltage in response to the fourth bias current, and a fifth bias current generator that receives the second output voltage and outputs a fifth bias current to the peripheral circuit in response to the second output voltage.

According to an embodiment, an operating method of a bias current generating device includes storing a code which is generated based on an external resistor, calibrating a resistance value of a variable resistor, based on the stored code, and generating a process-independent bias current based on the calibrated variable resistor, and the external resistor is removed after the resistance value of the variable resistor is calibrated.

BRIEF DESCRIPTION OF THE DRAWINGS

The above and other objects and features of the present disclosure will become apparent by describing in detail embodiments thereof with reference to the accompanying drawings.

FIG. 17 illustrates an example of an electronic device according to an embodiment of the present disclosure.

DETAILED DESCRIPTION

Embodiments of the present invention are described below, in such clear and concise detail, that the invention may be easily implemented by the artisan of skill in the art.

In the accompanying drawings and the following descriptions, multiplexers that have two terminals on a first side thereof and have one terminal on a second side thereof are illustrated and described. Each of the multiplexers should be construed as operating in three configuration modes.

For example, a multiplexer that has a first terminal and a second terminal on a first side thereof and has one terminal on a second side thereof may include at least one configuration mode where the first terminal of the first side and the one terminal of the second side are directly connected, a configuration mode where the second terminal of the first side and the one terminal of the second side are directly connected, and a configuration mode where the first and second terminals of the first side and the one terminal of the second side are connected through a multiplexer, or a combination of two or more of the same.

Figure 1:
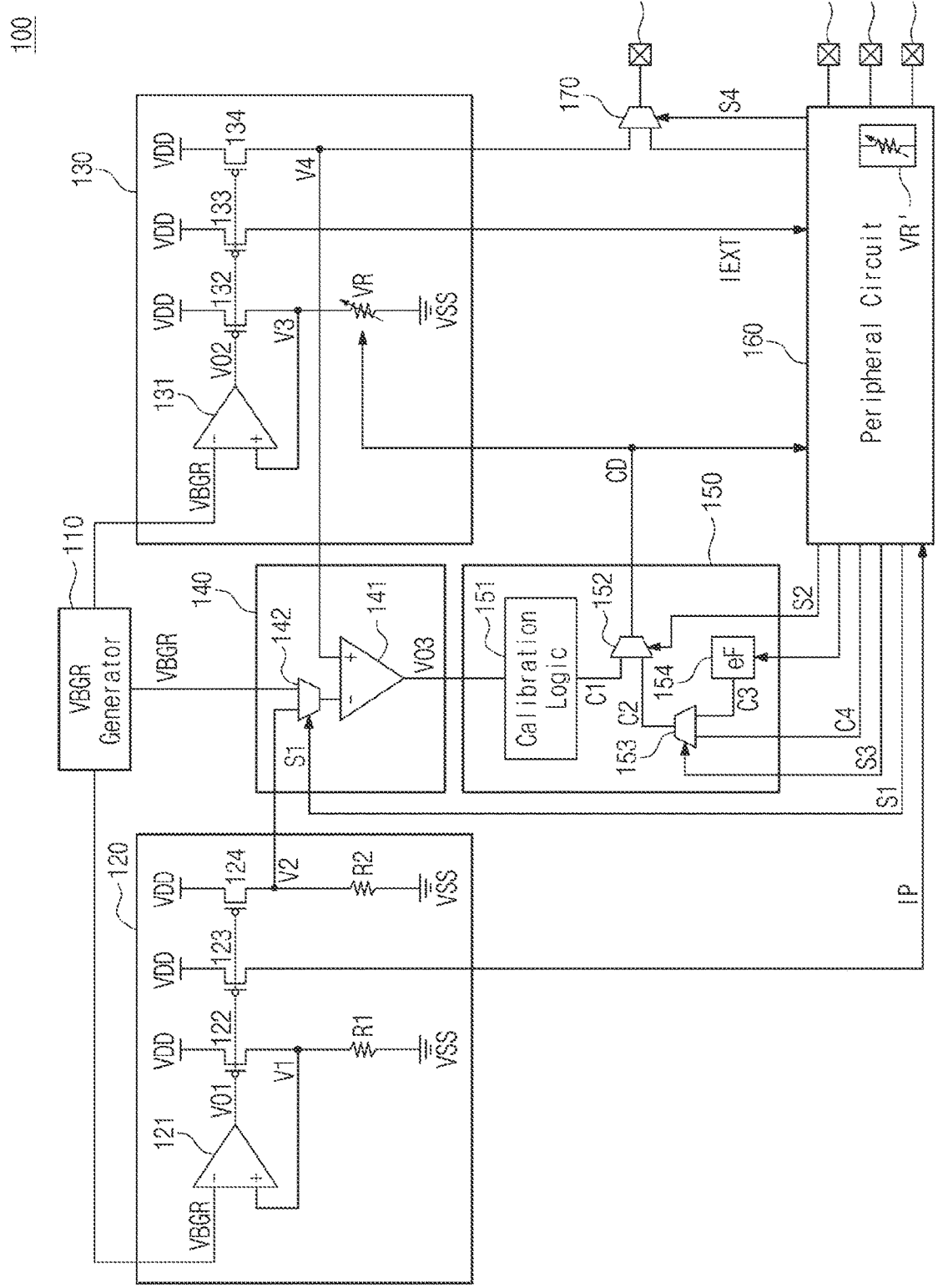
FIG. 1 illustrates a bias current generating device according to a first embodiment of the present disclosure.

FIG. 1 illustrates a bias current generating device 100 according to a first embodiment of the present disclosure. Referring to FIG. 1, the bias current generating device 100 may include a bandgap reference voltage generator 110, a first bias current generating circuit 120, a second bias current generating circuit 130, a comparison circuit 140, a calibration circuit 150, a peripheral circuit 160, a multiplexer 170, and first to fourth pads P1 to P4.

The bandgap reference voltage generator 110 may output a bandgap reference voltage VBGR. In an embodiment, the bandgap reference voltage generator 110 may be implemented to output any other reference voltage (e.g., being alternative bandgap reference voltage VBGR) that is generated from the bandgap reference voltage VBGR.

The first bias current generating circuit 120 may generate a process-dependent bias current IP. The process-dependent bias current IP may be a current to which a process variation is applied. The process-dependent bias current IP may be transferred to the peripheral circuit 160. The process-dependent bias current IP may be used by a component, which has a process variation canceling out the process variation of the process-dependent bias current IP, from among any of the components of the peripheral circuit 160.

The first bias current generating circuit 120 may include a first amplifier 121, a first bias current generator 122, a second bias current generator 123, a third bias current generator 124, a first resistor R1, and a second resistor R2.

The first amplifier 121 may receive the bandgap reference voltage VBGR and a first voltage V1. The first voltage V1 may be, for example, a voltage of an output node of the first bias current generator 122 or a voltage (e.g., a voltage drop) generated by the first resistor R1. The bandgap reference voltage VBGR may be applied to a negative input of the first amplifier 121, and the first voltage V1 may be applied to a positive input of the first amplifier 121. The first amplifier 121 may amplify a difference between the first voltage V1 and the bandgap reference voltage VBGR to output a first output voltage VO1.

The first bias current generator 122 and the first resistor R1 may be serially connected between a power node to which a power supply voltage VDD is supplied and a ground node to which a ground voltage VSS is supplied. The first bias current generator 122 may output a first bias current in response to the first output voltage VO1. The first bias current may be applied to the ground node through the first resistor R1 and may generate the first voltage V1. For example, the first bias current generator 122 may be a PMOS transistor including a gate to which the first output voltage VO1 is supplied, a first terminal connected with the power node, and a second terminal connected with the first resistor R1.

The second bias current generator 123 may output a second bias current in response to the first output voltage VO1. For example, the second bias current may be applied to the peripheral circuit 160 as the process-dependent bias current IP. For example, the second bias current generator 123 may be a PMOS transistor including a gate to which the first output voltage VO1 is supplied, a first terminal connected with the power node, and a second terminal connected with the peripheral circuit 160.

The third bias current generator 124 and the second resistor R2 may be serially connected between the power node to which the power supply voltage VDD is supplied and the ground node to which the ground voltage VSS is supplied. The third bias current generator 124 may output a third bias current in response to the first output voltage VO1. The third bias current may be applied to the ground node through the second resistor R2 and may generate a second voltage V2.

For example, the second voltage V2 may be a voltage of an output node of the third bias current generator 124 or a voltage (e.g., a resultant voltage drop) generated by the second resistor R2. For example, the third bias current generator 124 may be a PMOS transistor including a gate to which the first output voltage VO1 is supplied, a first terminal connected with the power node, and a second terminal connected with the second resistor R2.

In an embodiment, the first output voltage VO1 may be generated based on the first resistor R1 to which a process variation is applied. Accordingly, a bias current that is generated based on the first output voltage VO1 may be process-dependent. That is, the second bias current that the second bias current generator 123 outputs may be the process-dependent bias current IP.

The first bias current generating circuit 120 may be expandable. Like the second bias current generator 123, in the case where there is added a PMOS including a gate configured to receive the first output voltage VO1, a first terminal connected with the power node, and a second terminal connected with the peripheral circuit 160 (or any other circuit), the added PMOS transistor may function as a bias current generator that supplies an additional process-dependent bias current IP to the peripheral circuit 160 (or any other circuit). That is, a source of the process-dependent bias current IP may be expanded through the addition of only a PMOS transistor and related wires.

The second bias current generating circuit 130 may generate a process-independent bias current IEXT. The process-independent bias current IEXT may be a current from which a process variation is removed. The process-independent bias current IEXT may be applied to the peripheral circuit 160. The process-independent bias current IEXT may be used by a component, which does not have a process variation, from any of the components of the peripheral circuit 160.

The second bias current generating circuit 130 may include a second amplifier 131, a fourth bias current generator 132, a fifth bias current generator 133, a sixth bias current generator 134, and a variable resistor VR.

The second amplifier 131 may receive the bandgap reference voltage VBGR and a third voltage V3. The third voltage V3 may be, for example, a voltage of an output node of the fourth bias current generator 132 or a voltage (e.g., a resultant voltage drop) generated by the variable resistor VR. The bandgap reference voltage VBGR may be transferred to a negative input of the second amplifier 131, and the third voltage V3 may be applied to a positive input of the second amplifier 131. The second amplifier 131 may amplify a difference between the third voltage V3 and the bandgap reference voltage VBGR to output a second output voltage VO2.

The fourth bias current generator 132 and the variable resistor VR may be serially connected between the power node to which the power supply voltage VDD is supplied and the ground node to which the ground voltage VSS is supplied. The fourth bias current generator 132 may output a fourth bias current in response to the second output voltage VO2. The fourth bias current may be applied to the ground node through the variable resistor VR and may generate the third voltage V3. For example, the fourth bias current generator 132 may be a PMOS transistor including a gate to which the second output voltage VO2 is supplied, a first terminal connected with the power node, and a second terminal connected with the variable resistor VR.

The fifth bias current generator 133 may output a fifth bias current in response to the second output voltage VO2. For example, the fifth bias current may be transferred to the peripheral circuit 160 as the process-independent bias current IEXT. For example, the fifth bias current generator 133 may be a PMOS transistor including a gate to which the second output voltage VO2 is supplied, a first terminal connected with the power node, and a second terminal connected with the peripheral circuit 160.

The sixth bias current generator 134 may be connected between the power node to which the power supply voltage VDD is supplied and the multiplexer 170. The sixth bias current generator 134 may output a sixth bias current in response to the second output voltage VO2. The sixth bias current may be applied to the first pad P1 through multiplexer 170 and may generate a fourth voltage V4.

For example, the fourth voltage V4 may be a voltage of an output node of the sixth bias current generator 134. For example, the sixth bias current generator 134 may be a PMOS transistor including a gate to which the second output voltage VO2 is supplied, a first terminal connected with the power node, and a second terminal connected with multiplexer 170.

In an embodiment, the variable resistor VR may be controlled by a calibration code CD to calibrate a change in a resistance value due to a process variation. That is, the second output voltage VO2 may be generated based on the variable resistor VR from which a process variation is removed. Accordingly, a bias current that is generated based on the second output voltage VO2 may be process-independent. That is, the fifth bias current that the fifth bias current generator 133 outputs may be a process-independent bias current IEXT.

The second bias current generating circuit 130 may be expandable. Like the fifth bias current generator 133, in the case where an added PMOS transistor, including a gate configured to receive the second output voltage VO2, a first terminal connected with the power node, and a second terminal connected with the peripheral circuit 160 (or any other circuit), the added PMOS transistor may function as a bias current generator that supplies an additional process-independent bias current IEXT to the peripheral circuit 160 (or any other circuit). That is, a source of the process-independent bias current IEXT may be expanded through the addition of a PMOS transistor and related wires.

The comparison circuit 140 may compare a process-independent voltage and a process-dependent voltage. The comparison circuit 140 may output a voltage corresponding to the amount of change of an internal resistor (e.g., the first resistor R1, the second resistor R2, or the variable resistor VR) due to a process variation in response to a comparison result. For example, the amount of change of the internal resistance may indicate a difference between a resistance value of a standard resistor and the resistance value of an internal resistor manufactured through a semiconductor process. The standard resistor may be an external resistor that is not manufactured in a semiconductor process.

The comparison circuit 140 may include a third amplifier 141 and a multiplexer 142. The third amplifier 141 may compare an output of the multiplexer 142 and an internal voltage of the second bias current generating circuit 130, for example, the fourth voltage V4. The fourth voltage V4 may be applied to a positive input of the third amplifier 141, and the output of the multiplexer 142 may be applied to a negative input of the third amplifier 141.

The third amplifier 141 may amplify a voltage difference between the fourth voltage V4 and the output of the multiplexer 142 to output a third output voltage VO3. In an embodiment, the internal voltage of the second bias current generating circuit 130, for example, the fourth voltage V4 may be a process-dependent voltage. The output of the multiplexer 142 may be a process-independent voltage. Accordingly, the third output voltage VO3 may indicate a difference between the process-independent voltage and the process-dependent voltage.

The multiplexer 142 may receive the bandgap reference voltage VBGR from the bandgap reference voltage generator 110. The multiplexer 142 may receive the second voltage V2 from the first bias current generating circuit 120. The multiplexer 142 may apply one of the bandgap reference voltage VBGR and the second voltage V2 to the third amplifier 141 in response to a first selection signal S1 from the peripheral circuit 160.

The bandgap reference voltage VBGR may have no influence on process-voltage-temperature (PVT) variations. Accordingly, the bandgap reference voltage VBGR may be a process-independent voltage.

The second voltage V2 may be a level obtained by multiplying the bandgap reference voltage VBGR by a ratio of a resistance value of the second resistor R2 to a resistance value of the first resistor R1. At the ratio of the resistance value of the second resistor R2 to the resistance value of the first resistor R1, a process variation of the first resistor R1 and a process variation of the second resistor R2 may be canceled out. Because the bandgap reference voltage VBGR is a process-independent voltage, the second voltage V2 may be a process-independent voltage. For example, when the resistance value (e.g., a designed resistance value) of the second resistor R2 and the resistance value (e.g., a designed resistance value) of the first resistor R1 are equal, the second voltage V2 may be equal to the bandgap reference voltage VBGR.

Both the second voltage V2 and the bandgap reference voltage VBGR input to the multiplexer 142 may be process-independent voltages. Accordingly, the output of the multiplexer 142 may be a process-independent voltage.

In an embodiment, the multiplexer 142 may be omitted. In this case, the comparison circuit 140 may be implemented such that the bandgap reference voltage VBGR is directly applied to the negative input of the third amplifier 141 or the second voltage V2 is directly applied to the negative input of the third amplifier 141.

Because voltage and resistance values are proportional, the third output voltage VO3 may indicate a difference between a resistance value of a process-independent resistor (e.g., a resistance value of a standard resistor) and a resistance value of a process-dependent resistor (e.g., a resistance value of an internal resistor). The third output voltage VO3 may be applied to the calibration circuit 150.

The calibration circuit 150 may receive the third output voltage VO3 from the comparison circuit 140. The calibration circuit 150 may generate the calibration code CD for calibrating a resistance value of the variable resistor VR. For example, the calibration code CD may calibrate a resistance value of the variable resistor VR to a resistance value of a process-independent resistor (e.g., a resistance value of a standard resistor not involved in the manufacturing process) by removing a process variation from the variable resistor VR. The calibration code CD may be applied to the variable resistor VR of the second bias current generating circuit 130 and may be applied to the peripheral circuit 160.

The calibration circuit 150 may include calibration logic 151, a first multiplexer 152, a second multiplexer 153, and an electrical fuse 154 (eF). The calibration logic 151 may generate a first code C1 from the third output voltage VO3. For example, the calibration logic 151 may generate the first code C1 from the third output voltage VO3 by performing analog-to-digital conversion based on a given gain and an offset. Alternatively, the calibration logic 151 may generate the first code C1 with reference to a given lookup table or by performing an operation of a given function on the third output voltage VO3.

The first multiplexer 152 may receive the first code C1 from the calibration logic 151 and may receive a second code C2 from the second multiplexer 153. In response to a second selection signal S2 received from the peripheral circuit 160, the first multiplexer 152 may output one of the first code C1 and the second code C2 as the calibration code CD.

The second multiplexer 153 may receive a third code C3 from the electrical fuse 154 and may receive a fourth code C4 from the peripheral circuit 160. In response to a third selection signal S3 received from the peripheral circuit 160, the second multiplexer 153 may output one of the third code C3 and the fourth code C4 as the second code C2.

The electrical fuse 154 may store the third code C3 as a calibration code. For example, the electrical fuse 154 may store a calibration code received from the peripheral circuit 160 as the third code C3.

In an embodiment, the calibration circuit 150 may be implemented in various configurations. For example, the first code C1 output from the calibration logic 151 may be output as the calibration code CD. The third code C3 stored in the electrical fuse 154 may be output as the calibration code CD. The fourth code C4 transferred from the peripheral circuit 160 may be output as the calibration code CD. In the case where the implementation of the calibration circuit 150 is changed, components that are not used may be omitted or may be kept as a disabled dummy circuit.

The peripheral circuit 160 may receive the process-dependent bias current IP from the first bias current generating circuit 120. The peripheral circuit 160 may receive the process-independent bias current IEXT from the second bias current generating circuit 130. The peripheral circuit 160 may receive the calibration code CD from the calibration circuit 150. The peripheral circuit 160 may communicate with an external device through the second to fourth pads P2 to P4.

The peripheral circuit 160 may be connected with the first pad P1 through multiplexer 170. When connected with the first pad P1, the peripheral circuit 160 may communicate with the external device through the first pad P1. The peripheral circuit 160 may output the first selection signal S1, the second selection signal S2, the third selection signal S3, and a fourth selection signal S4.

Peripheral circuit 160 may include an internal variable resistor VR'. The internal variable resistor VR' may have the same configuration and characteristics as the variable resistor VR. The internal variable resistor VR' may be implemented such that a process variation is removed by the calibration code CD.

The peripheral circuit 160 may receive the calibration code CD from the calibration circuit 150. The peripheral circuit 160 may output the calibration code CD received from the calibration circuit 150 as the fourth code C4 or as the third code C3. The peripheral circuit 160 may receive the calibration code CD from the external device through at least one of the first to fourth pads P1 to P4. The peripheral circuit 160 may store the calibration code CD received from the external device in the electrical fuse 154.

In an embodiment, a specific number of pads through which the peripheral circuit 160 communicates with an external device are illustrated in FIG. 1, but the number of pads through which the peripheral circuit 160 communicates with the external device is not so limited.

The multiplexer 170 may be connected with the sixth bias current generator 134 and the peripheral circuit 160. In response to the fourth selection signal S4 received from the peripheral circuit 160, the multiplexer 170 may connect one of the sixth bias current generator 134 and the peripheral circuit 160 to the first pad P1.

Figure 2:
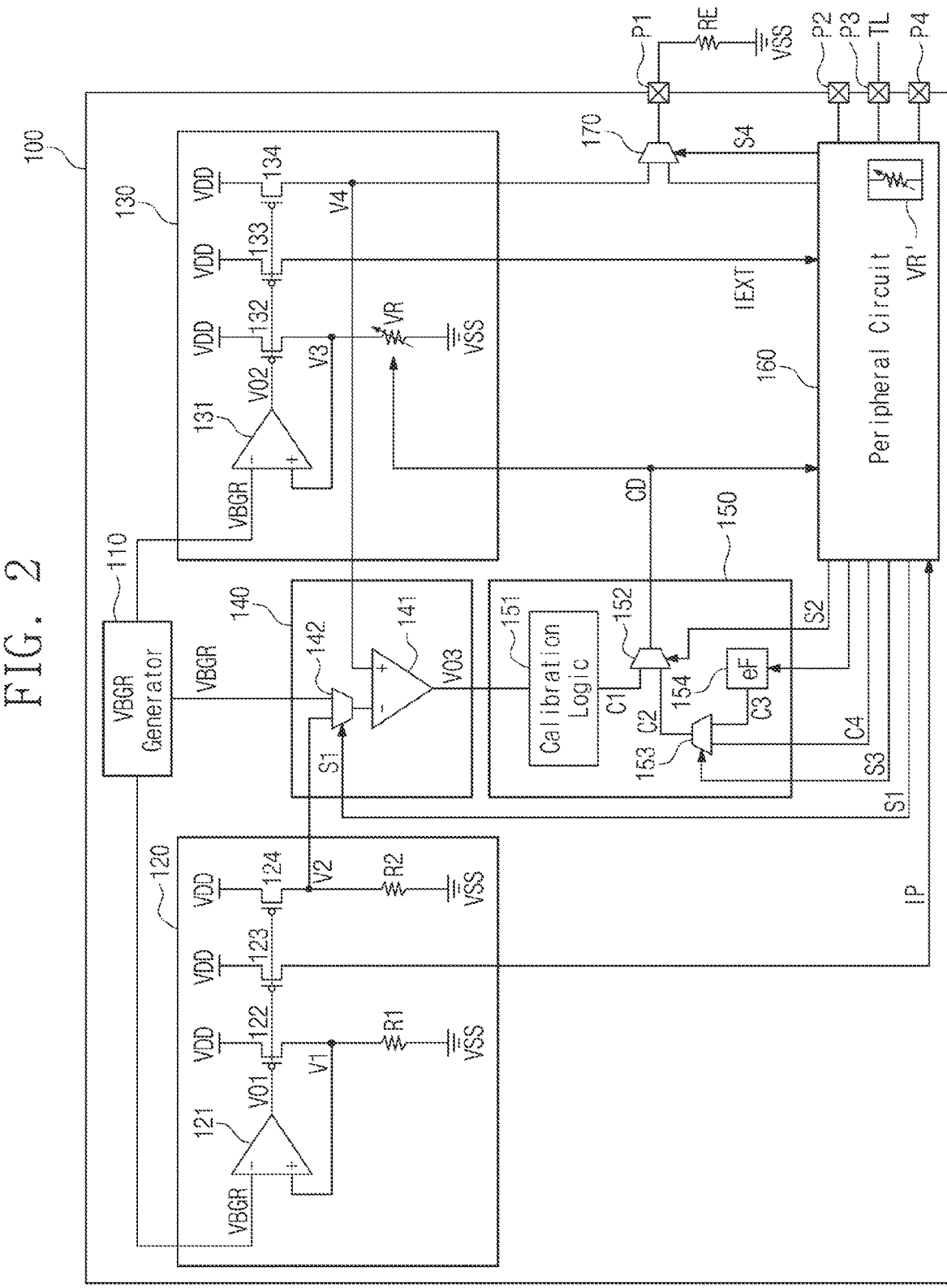
FIG. 2 illustrates an example in which a bias current generating device operates in a test operation.

FIG. 2 illustrates an example in which the bias current generating device 100 operates in a test operation. Referring to FIG. 2, an external resistor RE may be connected with the first pad P1. The external resistor RE may be a standard resistor that does not manufactured in a semiconductor manufacturing process. A design value (e.g., a designed resistance value) of the external resistor RE and a design value (e.g., a designed resistance value) of an internal resistor (e.g., R1, R2, or VR) may be equal. That is, a difference between the resistance value of the external resistor RE and the resistance value of the internal resistor (e.g., R1, R2, or VR) may indicate a process variation.

At least one of the second to fourth pads P2 to P4 may be connected with a test line TL. The peripheral circuit 160 may receive a test control signal from an external device (e.g., a test device) through the test line TL. The peripheral circuit 160 may control a test operation in response to the test control signal.

For example, the test operation may include a wafer test operation. The external resistor RE may be a wafer resistor implemented in an unused region of a wafer or a test resistor implemented at a test device. The test device may be a wafer test device. For another example, the test operation may include a package test operation. The external resistor RE may be a test resistor implemented at a test device. The test device may be a package test device.

When the test operation starts, the variable resistor VR may be in a uncalibrated state. That is, the variable resistor VR may have a process variation. The fourth voltage V4 may be a level obtained by multiplying the bandgap reference voltage VBGR by a ratio of a resistance value of the external resistor RE to a resistance value of the variable resistor VR. Because a process variation of the variable resistor VR is not canceled out, the fourth voltage V4 may be a process-dependent voltage.

As described with reference to FIG. 1, the output of the multiplexer 142 may be a process-independent voltage. Accordingly, the third output voltage VO3 of the third amplifier 141 may indicate a voltage difference of the fourth voltage V4 as being process-dependent and the output of the multiplexer 142 being process-independent, that is, an influence of a process.

When the calibration code CD is generated by the calibration circuit 150, the resistance value of the variable resistor VR may be adjusted. As the resistance value of the variable resistor VR is adjusted, the third output voltage VO3 of the third amplifier 141 may be adjusted. Operations of generating the calibration code CD and adjusting the resistance value of the variable resistor VR may be repeated until an absolute value of the third output voltage VO3 is smaller than a threshold value.

In response to that, the absolute value of the third output voltage VO3 is smaller than the threshold value, the peripheral circuit 160 may store the calibration code CD in the electrical fuse 154. The peripheral circuit 160 may store the calibration code CD in storage therein for the purpose of calibrating the internal variable resistor VR'.

Figure 3:
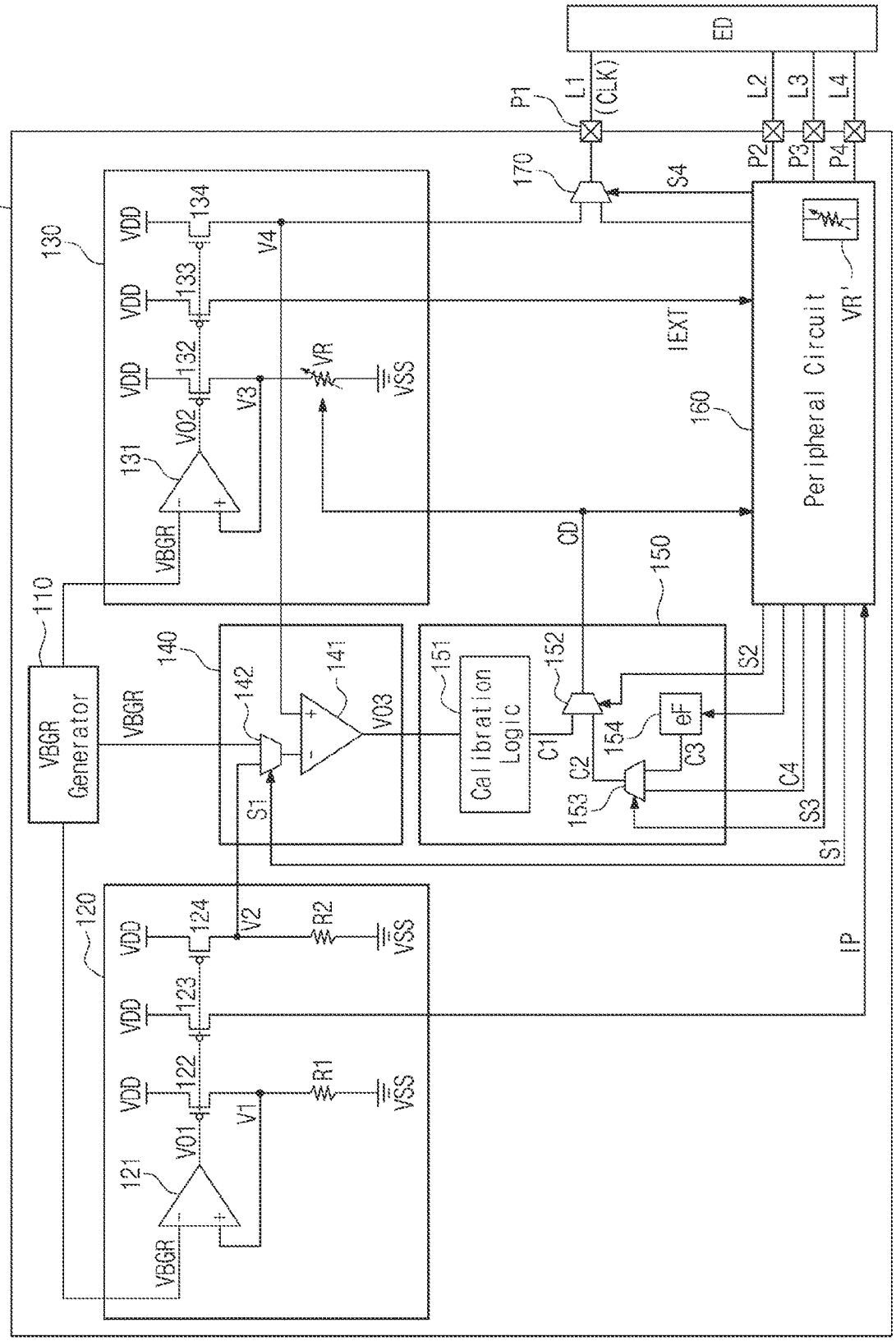
FIG. 3 illustrates an example in which a bias current generating device operates in a normal operation.

FIG. 3 illustrates an example in which the bias current generating device 100 operates in a normal operation. Referring to FIG. 3, a normal operation may indicate an operation that is performed when the bias current generating device 100 is coupled with an external device ED to implement one product. The external device ED may be coupled with the bias current generating device 100 to implement a system.

The first to fourth pads P1 to P4 may be coupled with the external device ED through first to fourth lines L1 to L4. The peripheral circuit 160 may control the multiplexer 170 through the fourth selection signal S4 such that the first pad P1 and the peripheral circuit 160 are electrically connected.

As described with reference to FIG. 2, the first pad P1 may be used for the connection with the external resistor RE in the test operation. As described with reference to FIG. 3, the first pad P1 may be used (reused) for communication with the external device ED in the normal operation. For example, the first pad P1 may be used to apply a clock signal CLK (e.g., a reference clock signal) through the first line L1.

When power is supplied to the bias current generating device 100 in normal operation, the bias current generating device 100 may calibrate a resistance value of the variable resistor VR based on the calibration code CD stored in the electrical fuse 154.

Figure 4:
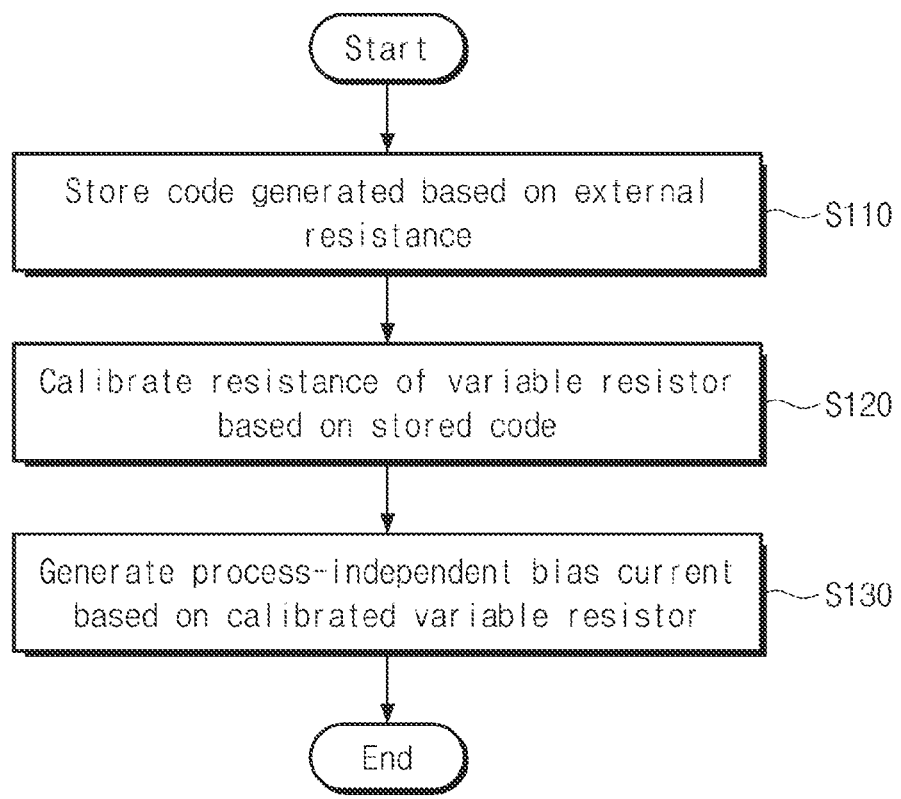
FIG. 4 illustrates an operating method of a bias current generating device according to the first embodiment of the present disclosure.

FIG. 4 illustrates an operating method of the bias current generating device 100 according to the first embodiment of the present disclosure. Referring to FIGS. 1, 2, 3, and 4, in operation S110, the bias current generating device 100 may store, in the electrical fuse 154, the calibration code CD generated based on the external resistor RE. For example, when the test operation described with reference to FIG. 2 is completed, the calibration code CD may be stored in the electrical fuse 154.

Afterwards, the external resistor RE may be removed. For example, when the test operation of FIG. 2 is a wafer-level test operation, the external resistor RE may be disconnected from the bias current generating device 100 in the process of sawing dies from a wafer. When the test operation of FIG. 2 is a wafer-level test operation or a package-level test operation, the external resistor RE may be disconnected from the bias current generating device 100 in the process of detaching the bias current generating device 100 from a test device.

In operation S120, the bias current generating device 100 may calibrate a resistance value of the variable resistor VR based on the calibration code CD thus stored. For example, as described with reference to FIG. 3, when power is supplied to the bias current generating device 100, the calibration code CD stored in the electrical fuse 154 may be transferred to the variable resistor VR. The resistance value of the variable resistor VR may be calibrated in response to the calibration code CD thus transferred. For example, the calibration code CD may calibrate the resistance value of the variable resistor VR to a design value by removing a process variation from the resistance value of the variable resistor VR.

In operation S130, the second bias current generating circuit 130 may generate the process-independent bias current IEXT, based on the calibrated resistance value of the variable resistor VR. Also, the first bias current generating circuit 120 may generate the process-dependent bias current IP, based on the first resistor R1.

Figure 5:
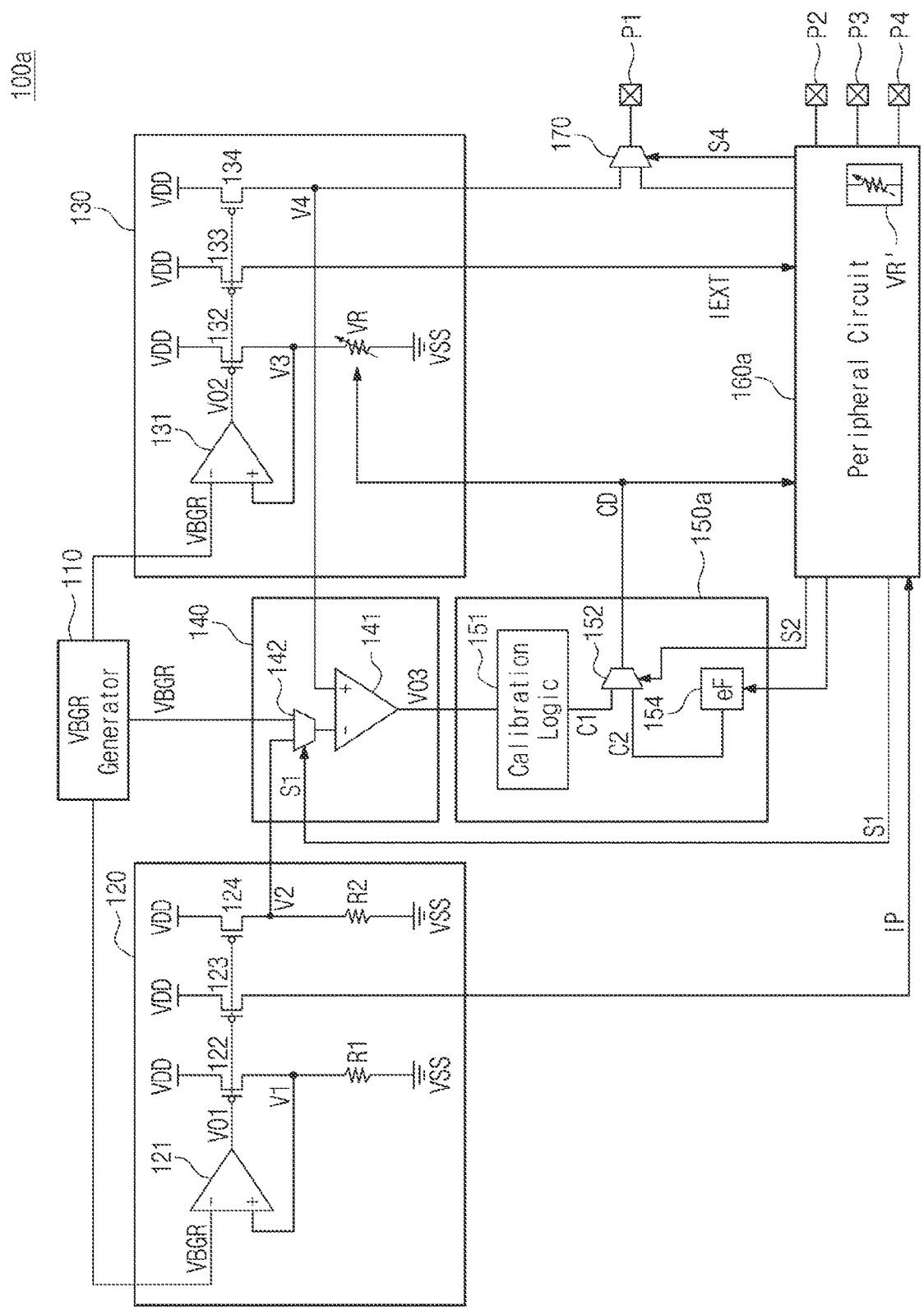
FIG. 5 illustrates a bias current generating device according to a second embodiment of the present disclosure.

FIG. 5 illustrates a bias current generating device 100a according to a second embodiment of the present disclosure. Referring to FIG. 5, the bias current generating device 100a may include the bandgap reference voltage generator 110, the first bias current generating circuit 120, the second bias current generating circuit 130, the comparison circuit 140, a calibration circuit 150a, a peripheral circuit 160a, multiplexer 170, and the first to fourth pads P1 to P4.

Operations and configurations of the bandgap reference voltage generator 110, the first bias current generating circuit 120, the second bias current generating circuit 130, the comparison circuit 140, the multiplexer 170, and the first to fourth pads P1 to P4 may be identical to those of the bandgap reference voltage generator 110, the first bias current generating circuit 120, the second bias current generating circuit 130, the comparison circuit 140, the multiplexer 170, and the first to fourth pads P1 to P4 described with reference to FIG. 1. Thus, additional description will be omitted as it would be redundant.

The calibration circuit 150a may include calibration logic 151, the first multiplexer 152, and the electrical fuse 154. Compared to the calibration circuit 150 of FIG. 1, the calibration circuit 150a may not include the second multiplexer 153. The calibration code CD stored in the electrical fuse 154 may be directly applied to the first multiplexer 152 as the second code C2. The peripheral circuit 160a may be implemented such that the fourth code C4 and the third selection signal S3 associated with the second multiplexer 153 of FIG. 1 are not output.

In an embodiment, all or part of components that are omitted compared to the bias current generating device 100 of FIG. 1 may be kept as dummy circuits in a disabled state (e.g., a state where a power is not supplied thereto or where a minimum of power is supplied thereto).

Figure 6:
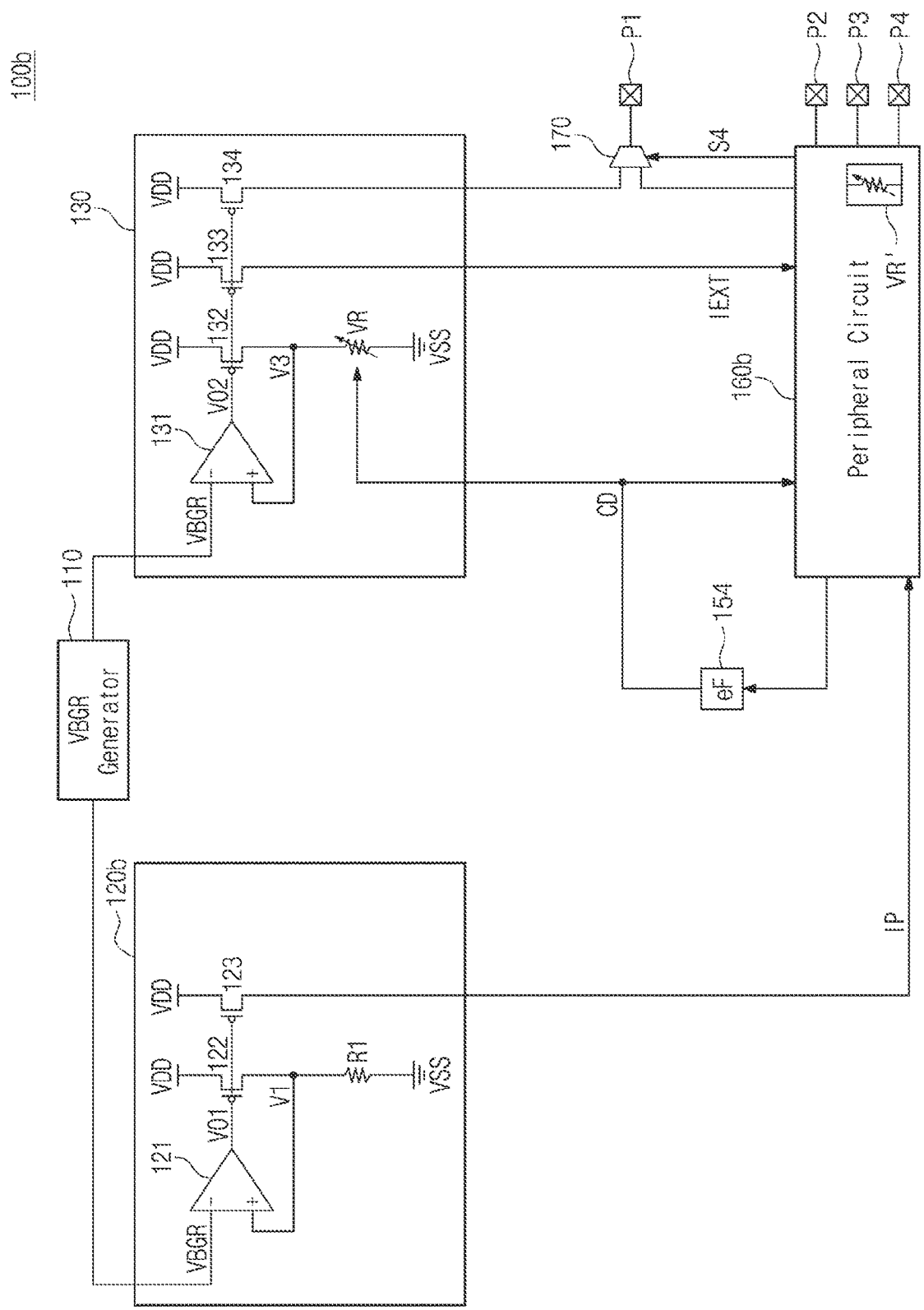
FIG. 6 illustrates a bias current generating device according to a third embodiment of the present disclosure.

FIG. 6 illustrates a bias current generating device 100b according to a third embodiment of the present disclosure. Referring to FIG. 6, the bias current generating device 100b may include the bandgap reference voltage generator 110, a first bias current generating circuit 120b, the second bias current generating circuit 130, the electrical fuse 154, a peripheral circuit 160b, multiplexer 170, and the first to fourth pads P1 to P4.

Operations and configurations of the bandgap reference voltage generator 110, the second bias current generating circuit 130, the multiplexer 170, and the first to fourth pads P1 to P4 may be identical to those of the bandgap reference voltage generator 110, the second bias current generating circuit 130, the multiplexer 170, and the first to fourth pads P1 to P4 described with reference to FIG. 1. Thus, additional description will be omitted as it would be redundant.

Compared to the bias current generating device 100 of FIG. 1, the bias current generating device 100b may not include the comparison circuit 140. Also, the remaining components of the calibration circuit 150 other than the electrical fuse 154 may be omitted. That is, the calibration circuit 150 may be replaced with the electrical fuse 154. The peripheral circuit 160b may be implemented such that signals associated with the omitted components are not output.

An external test device may lead a test operation for the bias current generating device 100b. The external test device may compare the fourth voltage V4 with a voltage generated therein, and may generate the calibration code CD based on a comparison result. The test device may transfer the calibration code CD to the peripheral circuit 160b. The peripheral circuit 160b may store the calibration code CD in the electrical fuse 154.

In a normal operation, a resistance value of the variable resistor VR may be calibrated based on the calibration code CD stored in the electrical fuse 154. Accordingly, the second bias current generating circuit 130 may generate the process-independent bias current IEXT.

Compared to the first bias current generating circuit 120 of FIG. 1, the first bias current generating circuit 120b may not include the third bias current generator 124 and the second resistor R2. In an embodiment, the third bias current generator 124 and the second resistor R2 are used to generate the second voltage V2 to be provided to the comparison circuit 140. Accordingly, when the comparison circuit 140 is omitted, the third bias current generator 124 and the second resistor R2 may also be omitted.

In an embodiment, all or part of components that are omitted compared to the bias current generating device 100 of FIG. 1 may be kept as dummy circuits on a disabled state (e.g., a state where a power is not supplied thereto or where a minimum of power is supplied thereto).

Figure 7:
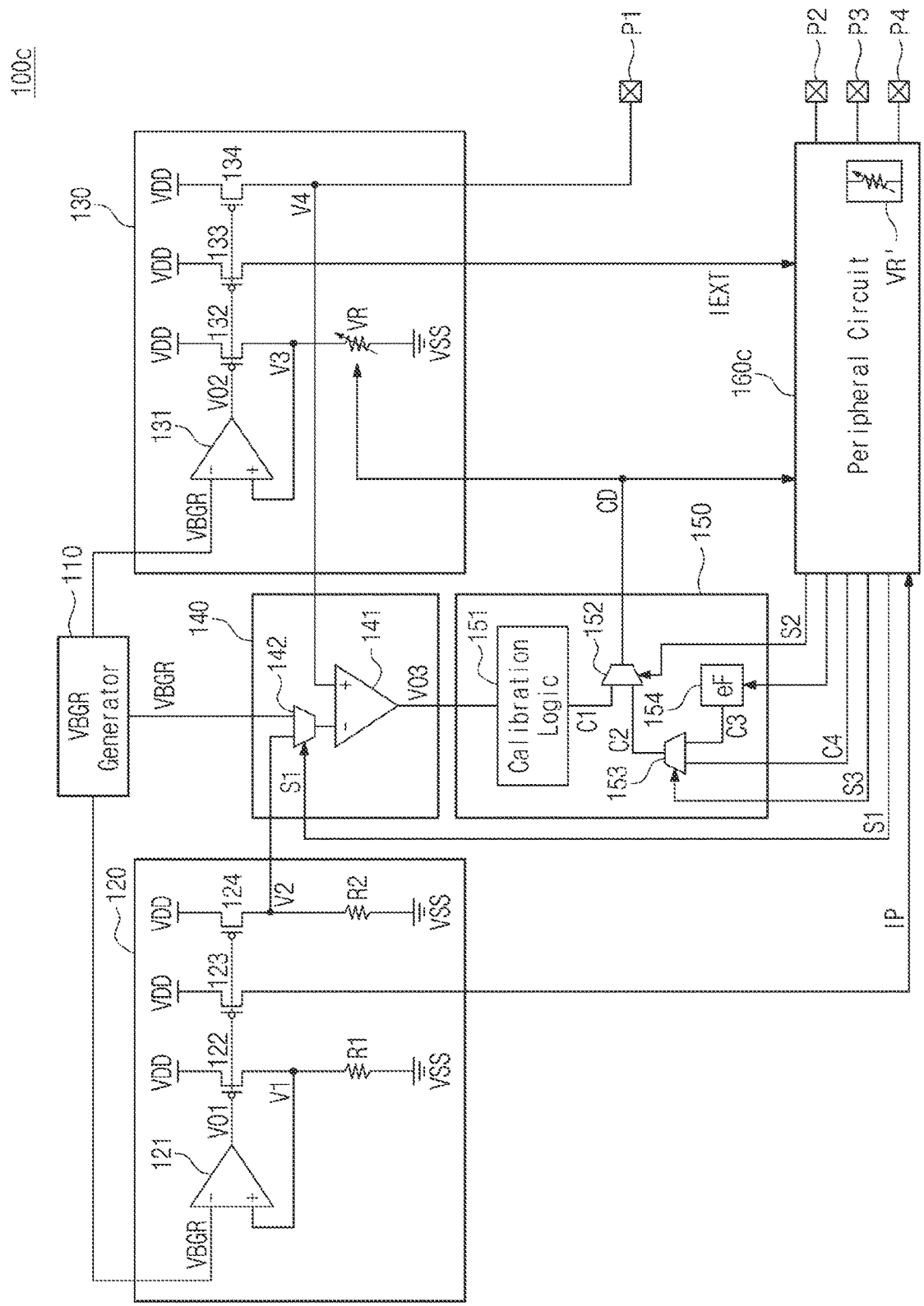
FIG. 7 illustrates a bias current generating device according to a fourth embodiment of the present disclosure.

FIG. 7 illustrates a bias current generating device 100c according to a fourth embodiment of the present disclosure. Referring to FIG. 7, the bias current generating device 100c may include the bandgap reference voltage generator 110, the first bias current generating circuit 120, the second bias current generating circuit 130, the comparison circuit 140, the calibration circuit 150, a peripheral circuit 160c, and the first to fourth pads P1 to P4.

Operations and configurations of the bandgap reference voltage generator 110, the first bias current generating circuit 120, the second bias current generating circuit 130, the comparison circuit 140, the calibration circuit 150, the multiplexer 170, and the first to fourth pads P1 to P4 may be identical to those of the bandgap reference voltage generator 110, the first bias current generating circuit 120, the second bias current generating circuit 130, the comparison circuit 140, the calibration circuit 150, the multiplexer 170, and the first to fourth pads P1 to P4 described with reference to FIG. 1. Thus, additional description will be omitted as redundant.

Compared to the bias current generating device 100 of FIG. 1, the bias current generating device 100c may not include the multiplexer 170. The sixth bias current generator 134 may be connected with the first pad P1, and the first pad P1 may be exclusively used for a test operation. The peripheral circuit 160c may be implemented such that signals associated with the multiplexer 170 of FIG. 1 are not output.

In an embodiment, all or part of components that are omitted compared to the bias current generating device 100 of FIG. 1 may be kept as dummy circuits on a disabled state (e.g., a state where a power is not supplied thereto or where a minimum of power is supplied thereto).

Figure 8:
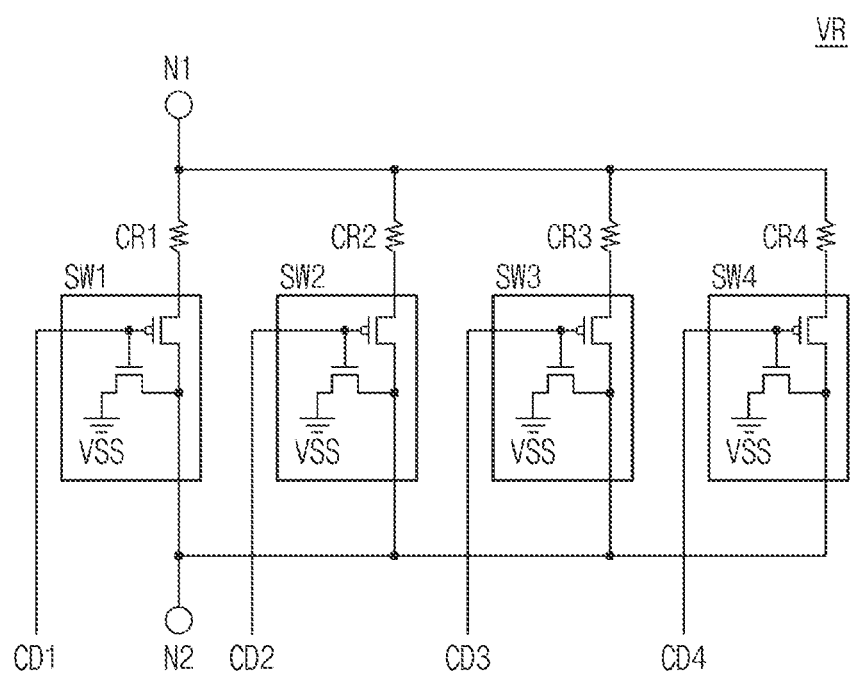
FIG. 8 illustrates an implementation example of a variable resistor of FIG. 1.

FIG. 8 illustrates an implementation example of the variable resistor VR of FIG. 1. Referring to FIGS. 1 and 8, the variable resistor VR may include first to fourth calibration resistors CR1 to CR4 connected in parallel, and first to fourth switches SW1 to SW4 that are respectively connected in series with the first to fourth calibration resistors CR1 to CR4 and their series combinations are connected in parallel.

The first to fourth calibration resistors CR1 to CR4 may have the same resistance values or different resistance values. The first to fourth calibration resistors CR1 to CR4 may have resistance values that sequentially increase by a factor of two.

The first to fourth switches SW1 to SW4 may respectively receive first to fourth codes CD1 to CD4. The first to fourth codes CD1 to CD4 may belong to the calibration code CD of FIG. 1. Depending on levels of the first to fourth codes CD1 to CD4, the first to fourth switches SW1 to SW4 may control whether to apply resistance values of the first to fourth calibration resistors CR1 to CR4 to a resistance value of the variable resistor VR.

For example, when a specific code has a first level (e.g., a low level), a calibration resistor corresponding to the specific code may be applied to the resistance value of the variable resistor VR. When the specific code has a second level (e.g., a high level), the calibration resistor corresponding to the specific code may not be applied to the resistance value of the variable resistor VR.

Each of the first to fourth switches SW1 to SW4 may include a PMOS transistor that includes a gate configured to receive a corresponding code, a first terminal connected with the corresponding calibration resistor, and a second terminal connected with a second node N2. Each of the first to fourth switches SW1 to SW4 may further include an NMOS transistor that includes a gate configured to receive a corresponding code, a first terminal connected with the second node N2, and a second terminal connected with the ground node.

Figure 9:
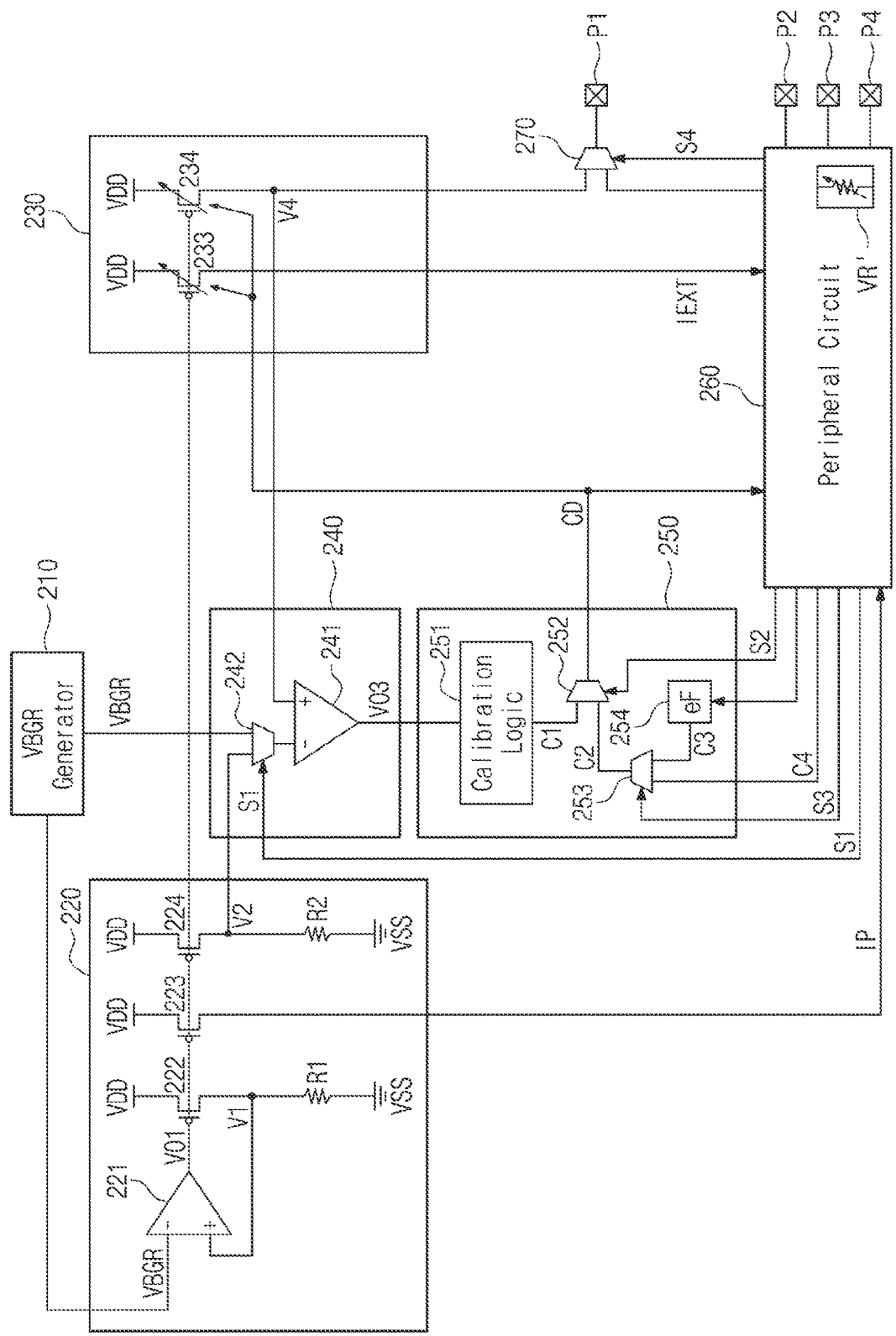
FIG. 9 illustrates a bias current generating device according to a fifth embodiment of the present disclosure.

FIG. 9 illustrates a bias current generating device 200 according to a fifth embodiment of the present disclosure. Referring to FIG. 9, the bias current generating device 200 may include a bandgap reference voltage generator 210, a first bias current generating circuit 220, a second bias current generating circuit 230, a comparison circuit 240, a calibration circuit 250, a peripheral circuit 260, a multiplexer 270, and first to fourth pads P1 to P4.

The bandgap reference voltage generator 210 may output the bandgap reference voltage VBGR. In an embodiment, the bandgap reference voltage generator 210 may be implemented to output any other reference voltage (e.g., being different from the bandgap reference voltage VBGR) that is generated from the bandgap reference voltage VBGR. A configuration and an operation of the bandgap reference voltage generator 210 may be identical to those of the bandgap reference voltage generator 110 of FIG. 1.

The first bias current generating circuit 220 may generate the process-dependent bias current IP. The process-dependent bias current IP may be a current to which a process variation is applied. The process-dependent bias current IP may be applied to the peripheral circuit 260. The process-dependent bias current IP may be used by a component, which has a process variation canceling out the process variation of the process-dependent bias current IP, from any of the components of the peripheral circuit 260.

The first bias current generating circuit 220 may include a first amplifier 221, a first bias current generator 222, a second bias current generator 223, a third bias current generator 224, a first resistor R1, and a second resistor R2. As in the above description given with reference to the first bias current generating circuit 120 of FIG. 1, the first voltage V1 and the second voltage V2 may be referred to in the first bias current generating circuit 220, and a configuration and an operation of the first bias current generating circuit 220 may be identical to the first bias current generating circuit 120. Thus, additional description will be omitted as redundant.

The second bias current generating circuit 230 may generate the process-independent bias current IEXT. The process-independent bias current IEXT may be a current from which a process variation is removed. The process-independent bias current IEXT may be applied to the peripheral circuit 260. The process-independent bias current IEXT may be used by a component, which does not have a process variation, from any of the components of the peripheral circuit 260.

The second bias current generating circuit 230 may include a fifth bias current generator 233 and a sixth bias current generator 234.

The fifth bias current generator 233 may output a fifth bias current in response to the first output voltage VO1. For example, the fifth bias current may be applied to the peripheral circuit 260 as the process-independent bias current IEXT. For example, the fifth bias current generator 233 may be a variable PMOS transistor including a gate to which the first output voltage VO1 is supplied, a first terminal connected with the power node, and a second terminal connected with the peripheral circuit 260. The variable PMOS transistor may be configured to adjust (e.g., while a gate voltage is uniform (or kept at the same level)) the amount of output current (e.g., a driving strength) in response to a control code (e.g., a calibration code).

The sixth bias current generator 234 may be connected between the power node to which the power supply voltage VDD is supplied and the multiplexer 270. The sixth bias current generator 234 may output a sixth bias current in response to the first output voltage VO1. The sixth bias current may be applied to the first pad P1 through the multiplexer 270 and may generate a fourth voltage V4.

For example, the fourth voltage V4 may be a voltage of an output node of the sixth bias current generator 234. For example, the sixth bias current generator 234 may be a variable PMOS transistor including a gate to which the first output voltage VO1 is supplied, a first terminal connected with the power node, and a second terminal connected with the multiplexer 270.

In an embodiment, the variable PMOS transistor may be controlled by the calibration code CD to calibrate a change in voltage due to a process variation. As described with reference to FIGS. 1 and 2, the second voltage V2 may be a voltage from which a process variation is removed (or which does not include a process variation). When the first pad P1 is connected with the external resistor RE, the fourth voltage V4 may be a voltage to which a process variation of the sixth bias current generator 234 is applied.

The calibration code CD for removing a process variation from the sixth bias current generator 234 may be obtained by calibrating the sixth bias current generator 234 such that the second voltage V2 and the fourth voltage V4 are equal. As the calibration code CD thus obtained is applied to the fifth bias current generator 233, a process variation of the fifth bias current generator 233 may be removed. That is, the fifth bias current that the fifth bias current generator 233 outputs may be the process-independent bias current IEXT.

The second bias current generating circuit 230 may be expandable. Like the second bias current generator 230, in the case where there is added a variable PMOS including a gate configured to receive the first output voltage VO1, a first terminal connected with the power node, and a second terminal connected with the peripheral circuit 260 (or any other circuit) and the calibration code CD is provided to the added variable PMOS transistor, the added variable PMOS transistor may function as a bias current generator that supplies an additional process-independent bias current IEXT to the peripheral circuit 260 (or any other circuit).

The comparison circuit 240 may include a third amplifier 241 and a multiplexer 242. As in the above description given with reference to the comparison circuit 140 of FIG. 1, the third amplifier 241 may output the third output voltage VO3, and a configuration and an operation of the comparison circuit 240 may be identical to those of the comparison circuit 140. Thus, additional description will be omitted as redundant.

The calibration circuit 250 may include calibration logic 251, a first multiplexer 252, a second multiplexer 253, and an electrical fuse 254 (eF). A configuration and an operation of the calibration circuit 250 may be identical to those of the calibration circuit 150 described with reference to FIG. 1. Thus, additional description will be omitted as redundant.

In an embodiment, the calibration circuit 250 may be implemented in various ways. For example, a first code C1 output from the calibration logic 251 may be output as the calibration code CD. A third code C3 stored in the electrical fuse 254 may be output as the calibration code CD. A fourth code C4 transferred from the peripheral circuit 260 may be output as the calibration code CD. In the case where the implementation of the calibration circuit 250 is changed, components that are not used may be omitted or may be kept as a disabled dummy circuit.

The peripheral circuit 260 may receive the process-dependent bias current IP from the first bias current generating circuit 220. The peripheral circuit 260 may receive the process-independent bias current IEXT from the second bias current generating circuit 230. The peripheral circuit 260 may receive the calibration code CD from the calibration circuit 250. The peripheral circuit 260 may communicate with an external device through the second to fourth pads P2 to P4.

The peripheral circuit 260 may be connected with the first pad P1 through multiplexer 270. When connected with the first pad P1, the peripheral circuit 260 may communicate with an external device through the first pad P1. The peripheral circuit 260 may output a first selection signal S1, a second selection signal S2, a third selection signal S3, and a fourth selection signal S4.

The peripheral circuit 260 may include an internal variable resistor VR'. The internal variable resistor VR' may have the same configuration and characteristic as the variable resistor VR. The internal variable resistor VR' may be implemented such that a process variation is removed by the calibration code CD.

The peripheral circuit 260 may receive the calibration code CD from the calibration circuit 250. The peripheral circuit 260 may output the calibration code CD received from the calibration circuit 250 as the fourth code C4 or as the third code C3. The peripheral circuit 260 may receive the calibration code CD from the external device through at least one of the first to fourth pads P1 to P4. The peripheral circuit 260 may store the calibration code CD received from the external device in the electrical fuse 254.

In an embodiment, a specific number of pads through which the peripheral circuit 260 communicates with the external device are illustrated in FIG. 1, but the number of pads through which the peripheral circuit 260 communicates with the external device is not so limited.

The multiplexer 270 may be connected with the sixth bias current generator 234 and the peripheral circuit 260. In response to the fourth selection signal S4 received from the peripheral circuit 260, the multiplexer 270 may connect one of the sixth bias current generator 234 and the peripheral circuit 260 to the first pad P1.

Figure 10:
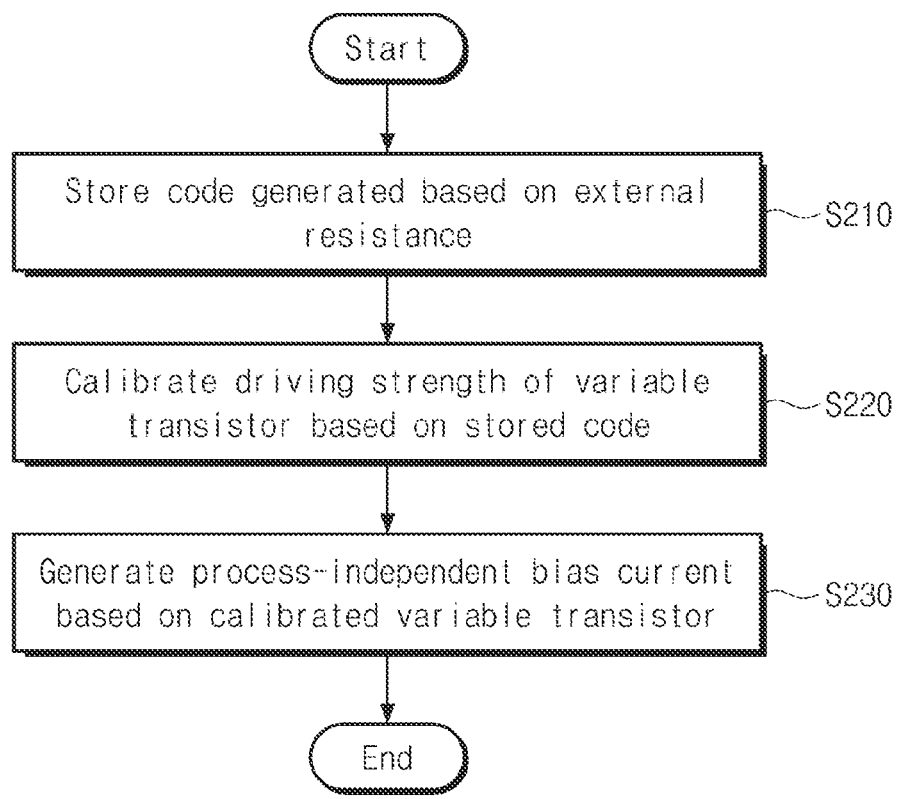
FIG. 10 illustrates an operating method of a bias current generating device according to the fifth embodiment of the present disclosure.

FIG. 10 illustrates an operating method of the bias current generating device 200 according to the fifth embodiment of the present disclosure. Referring to FIGS. 9 and 10, in operation S210, the bias current generating device 200 may store, in the electrical fuse 254, the calibration code CD generated based on the external resistor RE. For example, when the test operation described with reference to FIG. 2 is completed, the calibration code CD may be stored in the electrical fuse 254.

Afterwards, the external resistor RE may be removed. For example, when the test operation of FIG. 2 is a wafer-level test operation, the external resistor RE may be disconnected from the bias current generating device 200 in the process of sawing dies from a wafer. When the test operation of FIG. 2 is a wafer-level test operation or a package-level test operation, the external resistor RE may be disconnected from the bias current generating device 200 in the process of detaching the bias current generating device 200 from a test device.

In operation S220, the bias current generating device 200 may calibrate a driving strength value of a variable transistor based on the calibration code CD thus stored. For example, as described with reference to FIG. 3, when power is supplied to the bias current generating device 200, the calibration code CD stored in the electrical fuse 254 may be transferred to variable transistors of the fifth and sixth bias current generators 233 and 234. The driving strengths of the variable transistors may be calibrated in response to the calibration code CD thus transferred. For example, the calibration code CD may calibrate the driving strengths of the variable transistors to a design value by removing a process variation from the variable transistors.

Figure 11:
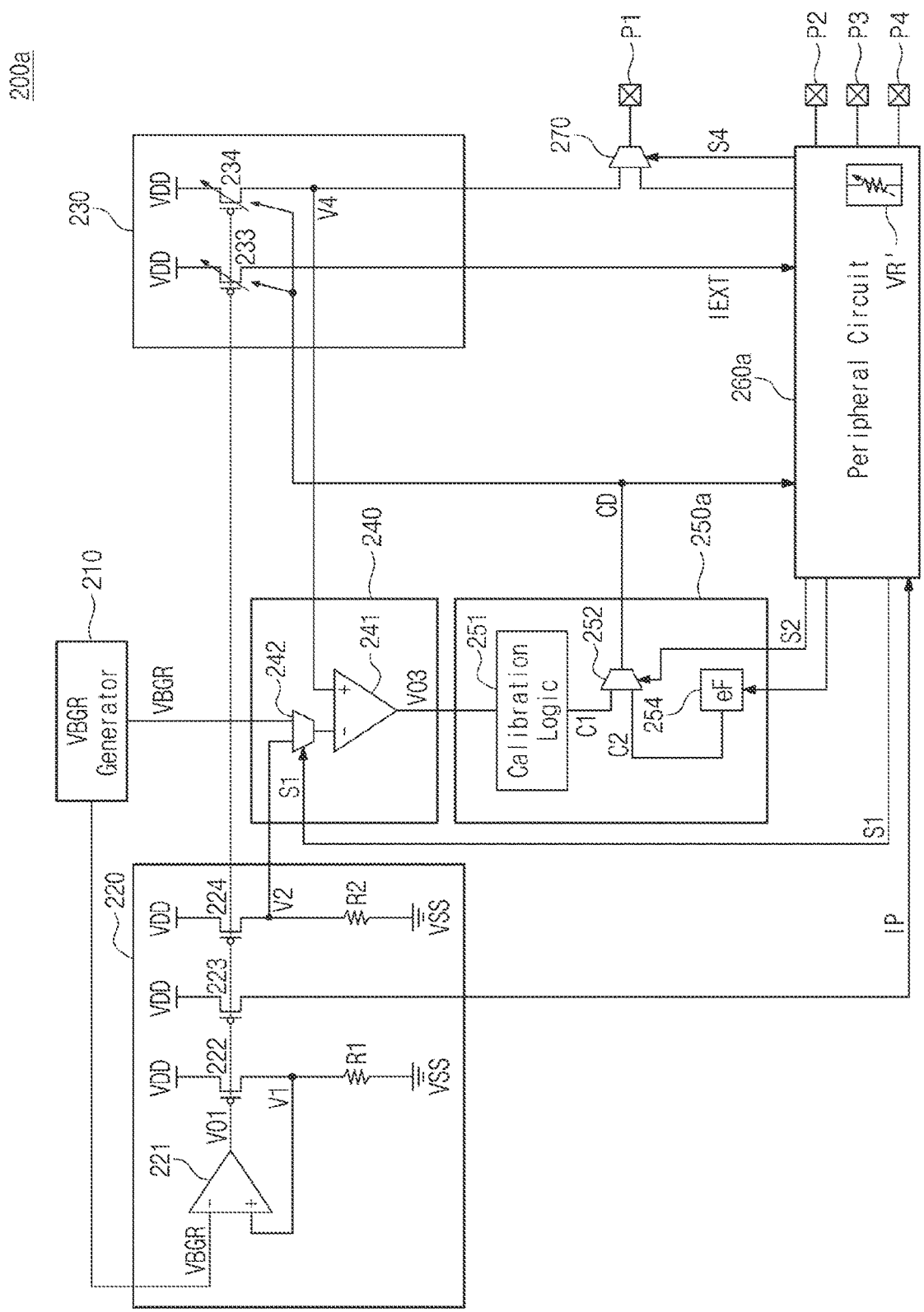
FIG. 11 illustrates a bias current generating device according to a sixth embodiment of the present disclosure.

In operation S230, the second bias current generating circuit 230 may generate the process-independent bias current IEXT, based on the calibrated driving strengths of the variable transistors. Also, the first bias current generating circuit 220 may generate the process-dependent bias current IP, based on the first resistor RE FIG. 11 illustrates a bias current generating device 200a according to a sixth embodiment of the present disclosure. Referring to FIG. 11, the bias current generating device 200a may include the bandgap reference voltage generator 210, the first bias current generating circuit 220, the second bias current generating circuit 230, the comparison circuit 240, a calibration circuit 250a, a peripheral circuit 260a, multiplexer 270, and the first to fourth pads P1 to P4.

Like the description given with reference to FIG. 5, compared to the calibration circuit 250 of FIG. 9, the calibration circuit 250a of FIG. 11 may not include the second multiplexer 253. The calibration code CD stored in the electrical fuse 254 may be directly transferred to the first multiplexer 252 as a second code C2. The peripheral circuit 260a may be implemented such that the fourth code C4 and the third selection signal S3 associated with the second multiplexer 253 of FIG. 9 are not output.

Figure 12:
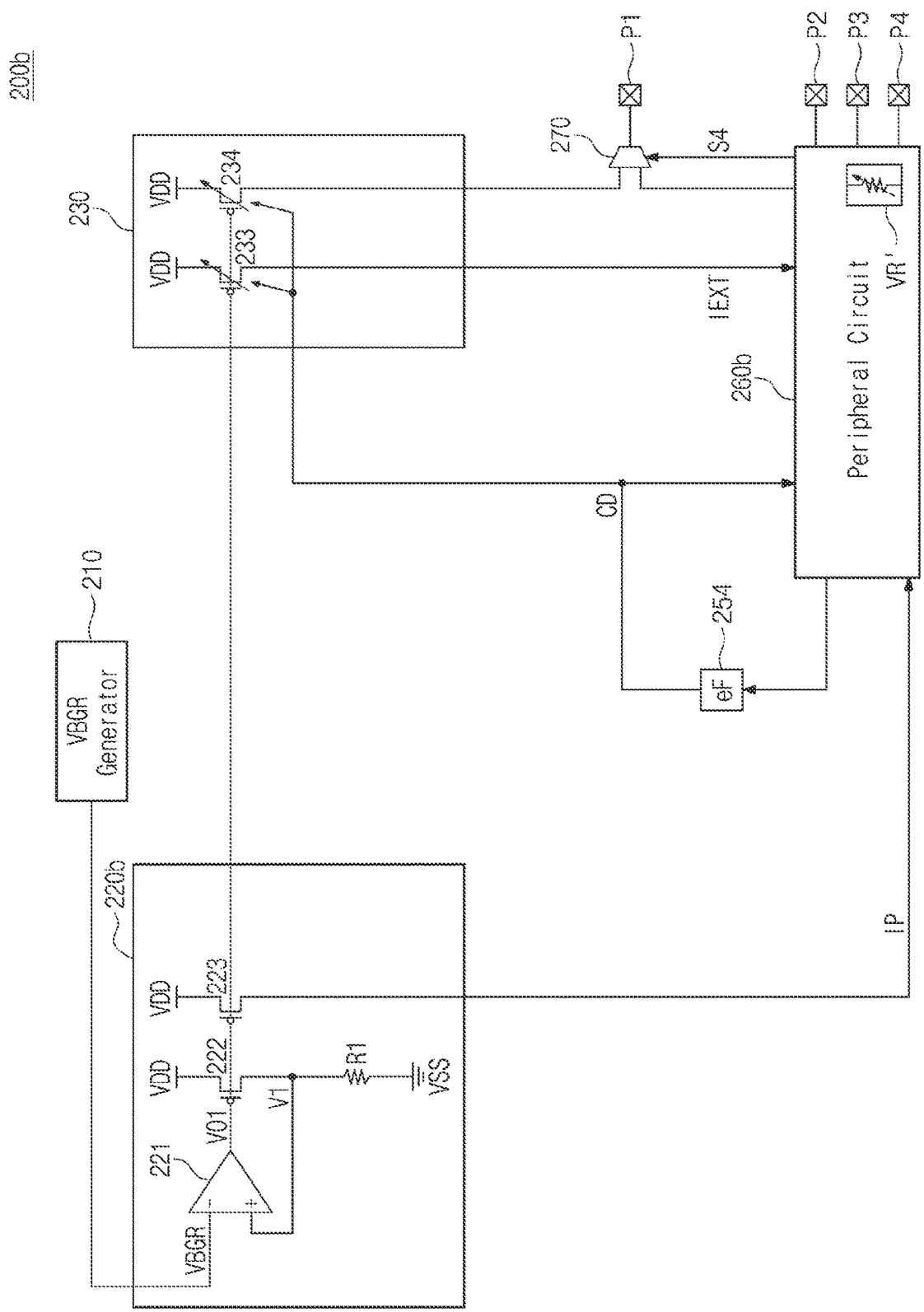
FIG. 12 illustrates a bias current generating device according to a seventh embodiment of the present disclosure.

FIG. 12 illustrates a bias current generating device 200b according to a seventh embodiment of the present disclosure. Referring to FIG. 12, the bias current generating device 200b may include the bandgap reference voltage generator 210, a first bias current generating circuit 220b, the second bias current generating circuit 230, the electrical fuse 254, a peripheral circuit 260b, multiplexer 270, and the first to fourth pads P1 to P4.

As described with reference to FIG. 6, compared to the bias current generating device 200 of FIG. 9, the bias current generating device 200b may not include the comparison circuit 240. Also, the remaining components of the calibration circuit 250 other than the electrical fuse 254 may be omitted. That is, the calibration circuit 250 may be replaced with the electrical fuse 254. The peripheral circuit 260b may be implemented such that signals associated with the omitted components are not output. As described with reference to FIG. 6, compared to the first bias current generating circuit 220 of FIG. 9, the first bias current generating circuit 220b may not include the third bias current generator 224 and the second resistor R2. A test operation, an operation of storing the calibration code CD in the electrical fuse 254, and a normal operation may be performed in identical manner to those described with reference to FIG. 6. Thus, additional description will be omitted as redundant.

Figure 13:
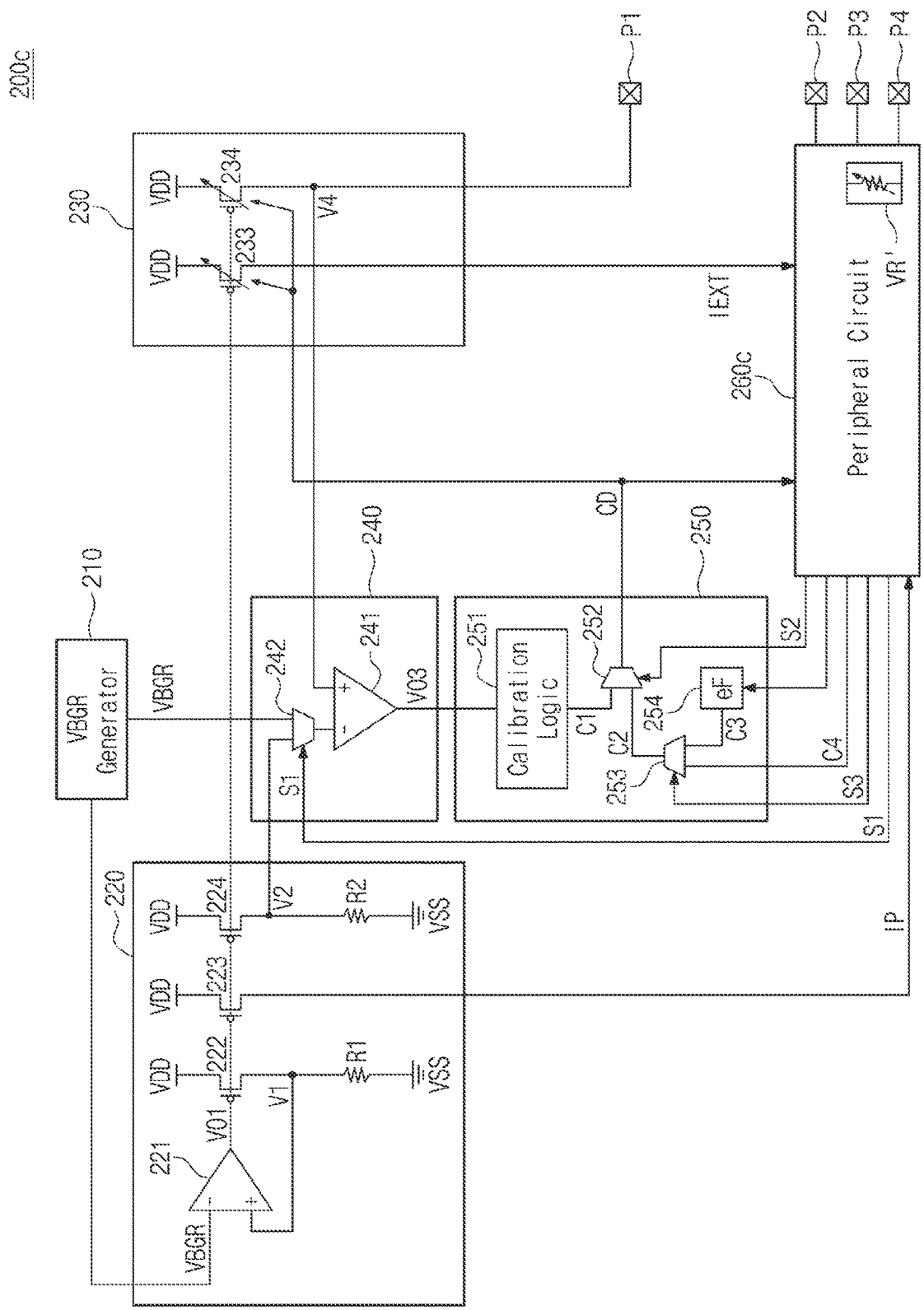
FIG. 13 illustrates a bias current generating device according to an eighth embodiment of the present disclosure.

FIG. 13 illustrates a bias current generating device 200c according to an eighth embodiment of the present disclosure. Referring to FIG. 13, the bias current generating device 200c may include the bandgap reference voltage generator 210, the first bias current generating circuit 220, the second bias current generating circuit 230, the comparison circuit 240, the calibration circuit 250, a peripheral circuit 260c, and the first to fourth pads P1 to P4.

As described with reference to FIG. 7, compared to the bias current generating device 200 of FIG. 9, the bias current generating device 200c may not include multiplexer 270.

Figure 14:
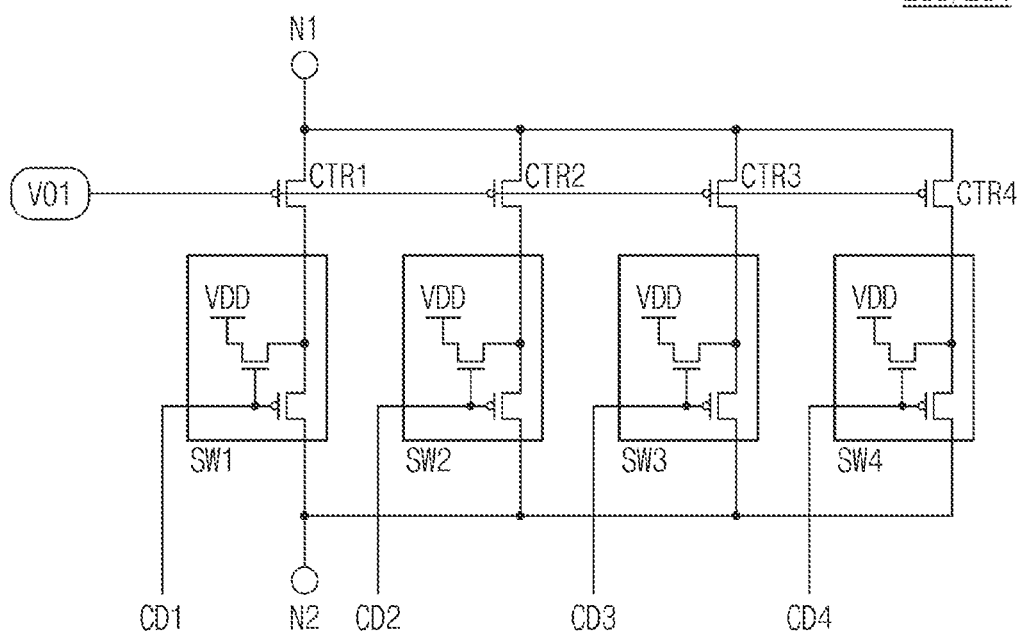
FIG. 14 illustrates an implementation example of a variable transistor.

FIG. 14 illustrates an implementation example of a variable transistor. Referring to FIGS. 9 and 14, a variable transistor may include first to fourth calibration transistors CTR1 to CTR4 connected in parallel, and first to fourth switches SW1 to SW4 that are respectively connected in series with the first to fourth calibration transistors CTR1 to CTR4 and which series combination is connected in parallel.

The first to fourth calibration transistors CTR1 to CTR4 may have the same sizes (or the same driving strengths) or different sizes (or driving strengths). The first to fourth calibration transistors CTR1 to CTR4 may have sizes that sequentially increase by a factor of two.

The first to fourth switches SW1 to SW4 may respectively receive first to fourth codes CD1 to CD4. The first to fourth codes CD1 to CD4 may belong to the calibration code CD of FIG. 9. Depending on levels of the first to fourth codes CD1 to CD4, the first to fourth switches SW1 to SW4 may control the application of driving strengths of the first to fourth calibration transistors CTR1 to CTR4 to a driving strength of the variable transistor.

For example, when a specific code has a first level (e.g., a low level), a calibration transistor corresponding to the specific code may be applied to the driving strength of the variable transistor. When the specific code has a second level (e.g., a high level), a calibration transistor corresponding to the specific code may not be applied to the driving strength of the variable transistor.

Each of the first to fourth switches SW1 to SW4 may include a PMOS transistor that includes a gate configured to receive the corresponding code, a first terminal connected with the corresponding calibration transistor, and a second terminal connected with a second node N2. Each of the first to fourth switches SW1 to SW4 may further include an NMOS transistor that includes a gate configured to receive the corresponding code, a first terminal connected with the corresponding calibration transistor, and a second terminal connected with the power node.

Figure 15:
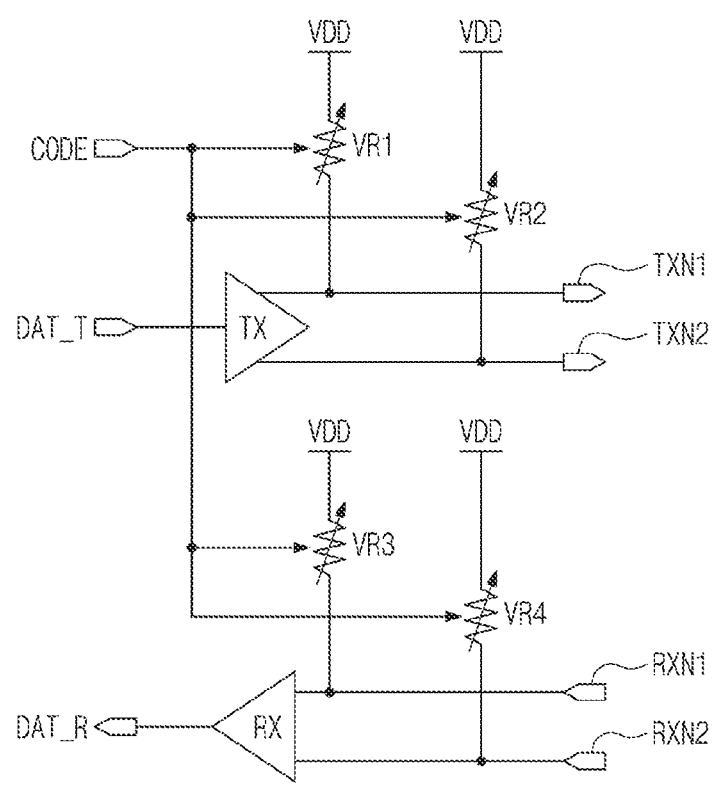
FIG. 15 illustrates an example of a component of a peripheral circuit including an internal variable resistor.

FIG. 15 illustrates an example of a component 330 of the peripheral circuit 160 or 260 including the internal variable resistor VR'. In an embodiment, the component 330 may include a transmitter TX and a receiver RX.

Referring to FIG. 15, the transmitter TX may transmit transmission data DAT_T through first and second transmission nodes TXN1 and TXN2. The first and second transmission nodes TXN1 and TXN2 may transmit complementary signals. For example, the first and second transmission nodes TXN1 and TXN2 may be included in the first to fourth pads P1 to P4.

The receiver RX may receive reception data DAT_R through first and second reception nodes RXN1 and RXN2. The first and second reception nodes RXN1 and RXN2 may receive complementary signals. For example, the first and second reception nodes RXN1 and RXN2 may be included in the first to fourth pads P1 to P4.

As termination resistors, first and second variable resistors VR1 and VR2 may be respectively connected with the first and second transmission nodes TXN1 and TXN2. The first variable resistor VR1 may be connected between the power node and the first transmission node TXN1, and the second variable resistor VR2 may be connected between the power node and the second transmission node TXN2.

Likewise, as termination resistors, third and fourth variable resistors VR3 and VR4 may be respectively connected with the first and second reception nodes RXN1 and RXN2. The third variable resistor VR3 may be connected between the power node and the first reception node RXN1, and the fourth variable resistor VR4 may be connected between the power node and the second reception node RXN2. The first and second reception nodes RXN1 and RXN2 may be included in the first to fourth pads P1 to P4.

The first to fourth variable resistors VR1 to VR4 that are used as termination resistors should be calibrated to remove process variations. For example, a code "CODE" for removing process variations may correspond to the calibration code CD stored in the electrical fuse 154 or 254.

In an embodiment, as described with reference to FIG. 8, the variable resistor VR is controlled by the calibration code CD to calibrate process variations. In the case where the first to fourth variable resistors VR1 to VR4 are implemented with the same replica as the variable resistor VR, the process variations applied to the first to fourth variable resistors VR1 to VR4 may be removed by the code "CODE" (e.g., a calibration code).

Since current and a resistance have an inverse relationship, in the case where a ratio of resistance values of the first to fourth calibration resistors VR1 to VR4 is set inversely to a ratio of the sizes of the calibration transistors CTR1 to CTR4 of the variable transistor (refer to FIG. 14), process variations applied to the first to fourth variable resistors VR1 to VR4 may be removed by the code "CODE".

The code "CODE" (e.g., a calibration code) for adjusting the size (i.e., a current amount) of the variable transistor may be directly used to adjust the resistance values of the first to fourth variable resistors VR1 to VR4, thus removing the process variations.

Figure 16:
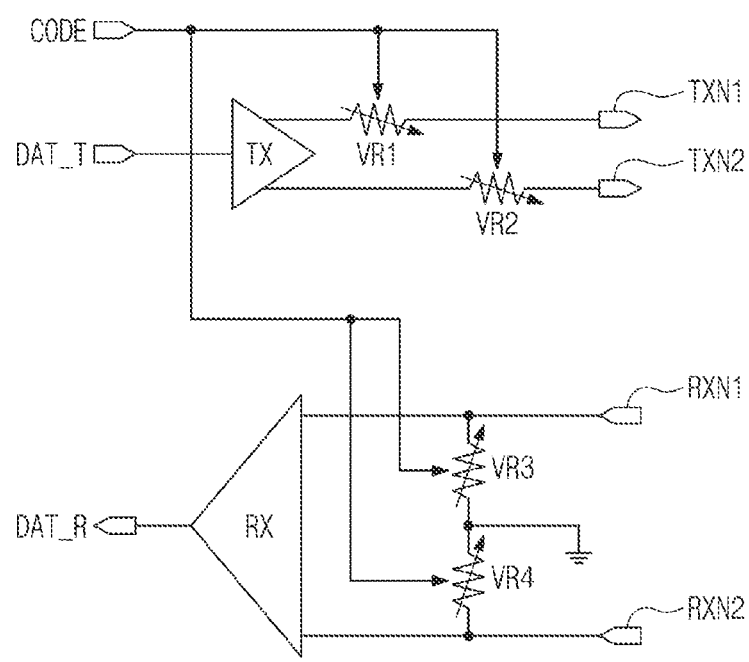
FIG. 16 illustrates an example of a component of a peripheral circuit including an internal variable resistor.

FIG. 16 illustrates an example of a component 340 of the peripheral circuit 160 or 260 including the internal variable resistor VR'. In an embodiment, the component 340 may include a transmitter TX and a receiver RX.

Referring to FIG. 16, the transmitter TX may transmit transmission data DAT_T through first and second transmission nodes TXN1 and TXN2. The first and second transmission nodes TXN1 and TXN2 may transmit complementary signals. For example, the first and second transmission nodes TXN1 and TXN2 may be included in the first to fourth pads P1 to P4.

As termination resistors, a first variable resistor VR1 and a second variable resistor VR2 may be respectively connected between the first transmission node TXN1 and the transmitter TX and between the second transmission node TXN2 and the transmitter TX. The first and second variable resistors VR1 and VR2 may be implemented to be identical to those described with reference to FIG. 15 and may be controlled by the code "CODE" in the same manner.

As termination resistances, third and fourth variable resistors VR3 and VR4 may be connected between the first and second reception nodes RXN1 and RXN2. The third and fourth variable resistors VR3 and VR4 may be implemented to be identical to those described with reference to FIG. 15 and may be controlled by the code "CODE" in the same manner. The first and second reception nodes RXN1 and RXN2 may be included in the first to fourth pads P1 to P4.

In the embodiments described above, examples of NMOS transistors and PMOS transistors are mentioned in detail. However, specific types of transistors do not limit the technical concept of the present disclosure. NMOS transistors and PMOS transistors may be used freely and/or interchangeably with each other while having complementary circuit structures.

FIG. 17 illustrates an example of an electronic device 1000 according to an embodiment of the present disclosure. Referring to FIG. 17, the electronic device 1000 may include a main processor 1100, a touch panel 1200, a touch driver integrated circuit (TDI) 1202, a display panel 1300, a display driver integrated circuit (DDI) 1302, a system memory 1400, a storage device 1500, an audio processor 1600, a communication block 1700, an image processor 1800, and a user interface 1900. In an embodiment, the electronic device 1000 may be one of various electronic devices such as a personal computer, a laptop computer, a server, a workstation, a portable communication terminal, a personal digital assistant (PDA), a portable media player (PMP), a digital camera, a smartphone, a tablet computer, and a wearable device.

The main processor 1100 may control overall operations of the electronic device 1000. The main processor 1100 may control/manage operations of the components of the electronic device 1000. The main processor 1100 may process various operations for the purpose of operating the electronic device 1000. The touch panel 1200 may be configured to sense a touch input from a user under control of the touch driver integrated circuit 1202. The display panel 1300 may be configured to display image information under control of the display driver integrated circuit 1302.

The system memory 1400 may store data that are used in an operation of the electronic device 1000. For example, the system memory 1400 may include a volatile memory such as a static random access memory (SRAM), a dynamic RAM (DRAM), or a synchronous DRAM (SDRAM), and/or a nonvolatile memory such as a phase-change RAM (PRAM), a magneto-resistive RAM (MRAM), a resistive RAM (ReRAM), or a ferroelectric RAM (FRAM).

The storage device 1500 may store data regardless of whether power is supplied to the same. For example, the storage device 1500 may include at least one of various nonvolatile memories such as a flash memory, a PRAM, an MRAM, a ReRAM, and a FRAM. For example, the storage device 1500 may include an embedded memory and/or a removable memory of the electronic device 1000.

The audio processor 1600 may process an audio signal by using an audio signal processor 1610. The audio processor 1600 may receive an audio input through a microphone 1620 or may provide an audio output through a speaker 1630. The communication block 1700 may exchange signals with an external device/system through an antenna 1710. A transceiver 1720 and a modulator/demodulator (MODEM) 1730 of the communication block 1700 may process signals exchanged with the external device/system, based on at least one of various wireless communication protocols: long term evolution (LTE), worldwide interoperability for microwave access (WiMax), global system for mobile communication (GSM), code division multiple access (CDMA), Bluetooth, near field communication (NFC), wireless fidelity (Wi-Fi), and radio frequency identification (RFID).

The image processor 1800 may receive light through a lens 1810. An image device 1820 and an image signal processor (ISP) 1830 included in the image processor 1800 may generate image information about an external object, based on received light. The user interface 1900 may include an interface capable of exchange information with a user, except for the touch panel 1200, the display panel 1300, the audio processor 1600, and the image processor 1800. The user interface 1900 may include a keyboard, a mouse, a printer, a projector, various sensors, a human body communication device, etc.

The electronic device 1000 may further include a power management IC (PMIC) 1010, a battery 1020, and a power connector 1030. The power management IC 1010 may generate an internal power from a power supplied from the battery 1020 or a power supplied from the power connector 1030, and may provide the internal power to the main processor 1100, the touch panel 1200, the touch driver integrated circuit (TDI) 1202, the display panel 1300, the display driver integrated circuit (DDI) 1302, the system memory 1400, the storage device 1500, the audio processor 1600, the communication block 1700, the image processor 1800, and the user interface 1900.

All or part of the components of the electronic device 1000 may include the bias current generating device 100 described with reference to FIG. 1 or the bias current generating device 200 described with reference to FIG. 9. The electronic device 1000 may be implemented to use the process-independent bias current IEXT and the process-dependent bias current IP with reduced size and complexity and improved expandability.

Alternatively, the electronic device 1000 may be implemented with a mobile device such as a smartphone and a smart pad. Alternatively, the electronic device 1000 may be implemented with various wearable devices such as a smart watch, smart glasses, or a virtual reality goggle.

In the above embodiments, components according to the present disclosure are described by using the terms "first", "second", "third", etc. However, the terms "first", "second", "third", etc. may be used to distinguish components from each other and do not limit the present disclosure. For example, the terms "first", "second", "third", etc. do not imply any order or numerical meaning of any form.

In the above embodiments, components according to embodiments of the present disclosure are referenced by using blocks. The blocks may be implemented with various hardware devices, such as an integrated circuit, an application specific IC (ASIC), a field programmable gate array (FPGA), and a complex programmable logic device (CPLD), firmware driven in hardware devices, software such as an application, or a combination of a hardware device and software. Also, the blocks may include circuits implemented with semiconductor elements in an integrated circuit, or circuits recognized as propietary.

According to the present disclosure, a process-independent bias current is calibrated by calibrating a resistance value of one variable resistor. Accordingly, a bias current generating device with reduced complexity, an integrated circuit including the bias current generating device, and an operating method of the bias current generating device are provided. Also, according to the present disclosure, when a resistance value of one variable resistor is calibrated, a source of a process-independent bias current is added solely through addition of a driving transistor. Accordingly, a bias current generating device with the improved expandability, an integrated circuit including the bias current generating device, and an operating method of the bias current generating device are provided.

While the present disclosure has been described with reference to embodiments thereof, it will be apparent to those of skill in the art that various changes and modifications may be made thereto without departing from the spirit and scope of the present disclosure as set forth in the following claims.

What is claimed is:

1. An integrated circuit comprising:
a peripheral circuit; and
a first bias current generating circuit,
wherein the first bias current generating circuit includes:
a first amplifier configured to receive a reference voltage and a first voltage, and to amplify a difference between the first voltage and the reference voltage to output a first output voltage;

a first bias current generator configured to receive the first output voltage, and to output a first bias current in response to the first output voltage;

a variable resistor configured to receive the first bias current from the first bias current generator, and to output said first voltage in response to the first bias current and a calibration code;

a second bias current generator configured to receive the first output voltage, and to output a second bias current to the peripheral circuit in response to the first output voltage; and a third bias current generator configured to receive the first output voltage, and to output a third bias current to an external device through a first pad in response to the first output voltage.

2. The integrated circuit of claim 1, further comprising: an electrical fuse configured to store the calibration code, wherein the calibration code stored in the electrical fuse is applied to the variable resistor.

3. The integrated circuit of claim 2, wherein the peripheral circuit receives the calibration code from the external device through a second pad and stores the received calibration code in the electrical fuse.

4. The integrated circuit of claim 1, wherein the peripheral circuit transfers the calibration code to the variable resistor.

5. The integrated circuit of claim 4, wherein the peripheral circuit receives the calibration code from the external device through a second pad and transfers the received calibration code to the variable resistor.

6. The integrated circuit of claim 1, further comprising: a second bias current generating circuit,
wherein the second bias current generating circuit includes:
a second amplifier configured to receive the reference voltage and a second voltage, and to amplify a difference between the second voltage and the reference voltage to output a second output voltage;
a fourth bias current generator configured to receive the second output voltage, and to output a fourth bias current in response to the second output voltage;
a first resistor configured to receive the fourth bias current from the fourth bias current generator, and to output the second voltage in response to the fourth bias current; and
a fifth bias current generator configured to receive the second output voltage, and to output a fifth bias current to the peripheral circuit in response to the second output voltage.

7. The integrated circuit of claim 6, wherein the second bias current generating circuit further includes:
a sixth bias current generator configured to receive the second output voltage, and to output a sixth bias current in response to the second output voltage; and
a second resistor configured to receive the sixth bias current from the sixth bias current generator, and to output a third voltage in response to the sixth bias current.

8. The integrated circuit of claim 7, further comprising:
a third amplifier configured to receive a voltage from an output node of the third bias current generator in the first bias current generating circuit and the third voltage, and to amplify a difference between the voltage of the output node and the third voltage to output a third output voltage.

9. The integrated circuit of claim 8, further comprising: calibration logic configured to receive the third output voltage, and to generate the calibration code from the third output voltage.

10. The integrated circuit of claim 6, further comprising:
a third amplifier configured to receive a voltage of an output node of the third bias current generator in the first bias current generating circuit and the reference voltage, and to amplify a difference between the voltage from the output node and the reference voltage to output a third output voltage.

11. The integrated circuit of claim 10, further comprising: calibration logic configured to receive the third output voltage, and to generate the calibration code from the third output voltage.

12. The integrated circuit of claim 11, wherein the calibration code output from the calibration logic is transferred to the variable resistor.

13. The integrated circuit of claim 11, further comprising: an electrical fuse,
wherein the calibration code output from the calibration logic is transferred to the peripheral circuit, and the peripheral circuit stores the calibration code transferred from the calibration logic in the electrical fuse.

14. A bias current generating device comprising:
an electrical fuse configured to store a calibration code;
a first amplifier configured to receive a reference voltage and a first voltage, and to amplify a difference between the first voltage and the reference voltage to output a first output voltage;
a first bias current generator configured to receive the first output voltage, and to output a first bias current in response to the first output voltage;
a variable resistor configured to receive the first bias current from the first bias current generator, to receive the calibration code from the electrical fuse, and to output the first voltage in response to the first bias current and the calibration code;
a second bias current generator configured to receive the first output voltage, and to output a second bias current to a peripheral circuit in response to the first output voltage;
a third bias current generator configured to receive the first output voltage, and to output a third bias current to an external device through a pad in response to the first output voltage;
a second amplifier configured to receive the reference voltage and a second voltage, and to amplify a difference between the second voltage and the reference voltage to output a second output voltage;
a fourth bias current generator configured to receive the second output voltage, and to output a fourth bias current in response to the second output voltage;
a first resistor configured to receive the fourth bias current from the fourth bias current generator, and to output the second voltage in response to the fourth bias current; and
a fifth bias current generator configured to receive the second output voltage, and to output a fifth bias current to the peripheral circuit in response to the second output voltage.

15. The bias current generating device of claim 14, further comprising:
a third amplifier configured to receive a voltage of an output node of the third bias current generator and the reference voltage, and to amplify a difference between the voltage of the output node and the reference voltage to output a third output voltage; and calibration logic configured to generate a second calibration code from the third output voltage.

16. The bias current generating device of claim 15, wherein the second calibration code, the second bias current, and the fourth bias current are transferred to the peripheral circuit, and
wherein the second calibration code is stored in the electrical fuse by the peripheral circuit as the calibration code.

17. The bias current generating device of claim 15, further comprising:
a first multiplexer configured to select and output one of an output of the electrical fuse and an output of the peripheral circuit; and
a second multiplexer configured to select and output one of an output of the first multiplexer and an output of the calibration logic,
wherein an output of the second multiplexer is transferred to the variable resistor.

18. The bias current generating device of claim 14, further comprising:
a sixth bias current generator configured to receive the second output voltage, and to output a sixth bias current in response to the second output voltage;
a second resistor configured to receive the sixth bias current from the sixth bias current generator, and to output a third voltage in response to the sixth bias current;
a multiplexer configured to receive the third voltage and the reference voltage, and to select and output one of the third voltage and the reference voltage;
a third amplifier configured to receive a voltage from an output node of the third bias current generator and an output voltage of the multiplexer, and to amplify a difference between the voltage of the output node and the output voltage of the multiplexer to output the third output voltage; and
calibration logic configured to receive the third output voltage, and to generate the calibration code from the third output voltage.

* * * * *